(12) United States Patent
Miyamoto et al.

(10) Patent No.: US 7,362,642 B2
(45) Date of Patent: Apr. 22, 2008

(54) MEMORY

(75) Inventors: Hideaki Miyamoto, Ogaki (JP); Shigeharu Matsushita, Katano (JP)

(73) Assignee: Sanyo Electric Co., Ltd., Osaka (JP)

( * ) Notice: Subject to any disclaimer, the term of this patent is extended or adjusted under 35 U.S.C. 154(b) by 2 days.

(21) Appl. No.: 11/494,748

(22) Filed: Jul. 28, 2006

(65) Prior Publication Data

US 2007/0025172 A1 Feb. 1, 2007

(30) Foreign Application Priority Data

Jul. 28, 2005 (JP) ............................. 2005-219072
Dec. 19, 2005 (JP) ............................. 2005-364769

(51) Int. Cl.
*G11C 7/00* (2006.01)

(52) U.S. Cl. .................. 365/222; 365/189.01

(58) Field of Classification Search ................ 365/222, 365/189.01, 189.07, 230.01, 230.03, 233, 365/145

See application file for complete search history.

(56) References Cited

U.S. PATENT DOCUMENTS 4,933,907 A * 6/1990 Kumanoya et al. ......... 365/222
6,421,292 B1 * 7/2002 Kitamoto et al. ........... 365/222

FOREIGN PATENT DOCUMENTS

JP 2001-229674 A 8/2001

* cited by examiner

*Primary Examiner*—Gene N. Auduong
(74) *Attorney, Agent, or Firm*—McDermott Will & Emery LLP

(57) ABSTRACT

A memory allowing reduction of the period of an external access operation is provided. This memory comprises an access control portion performing an internal access operation on the basis of an external access operation, a refresh control portion performing a refresh operation and a refresh division control portion dividing the refresh operation into a read operation RFRD and rewrite operations RFRS1 and RFRS2. The memory performs the read operation RFRD and the rewrite operations RFRS1 and RFRS2 at least either before or after different internal access operations corresponding to different external access operations respectively.

20 Claims, 16 Drawing Sheets

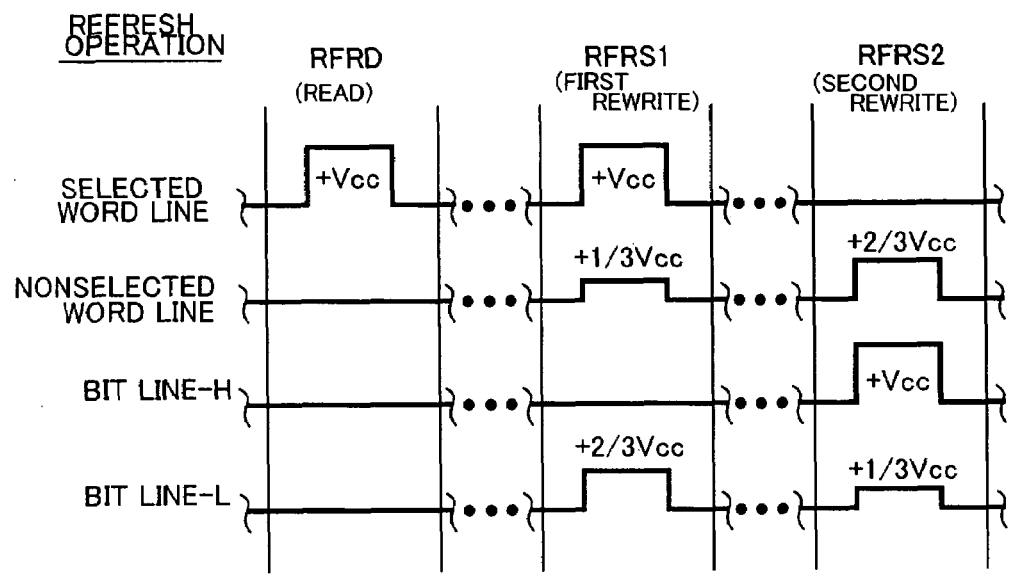
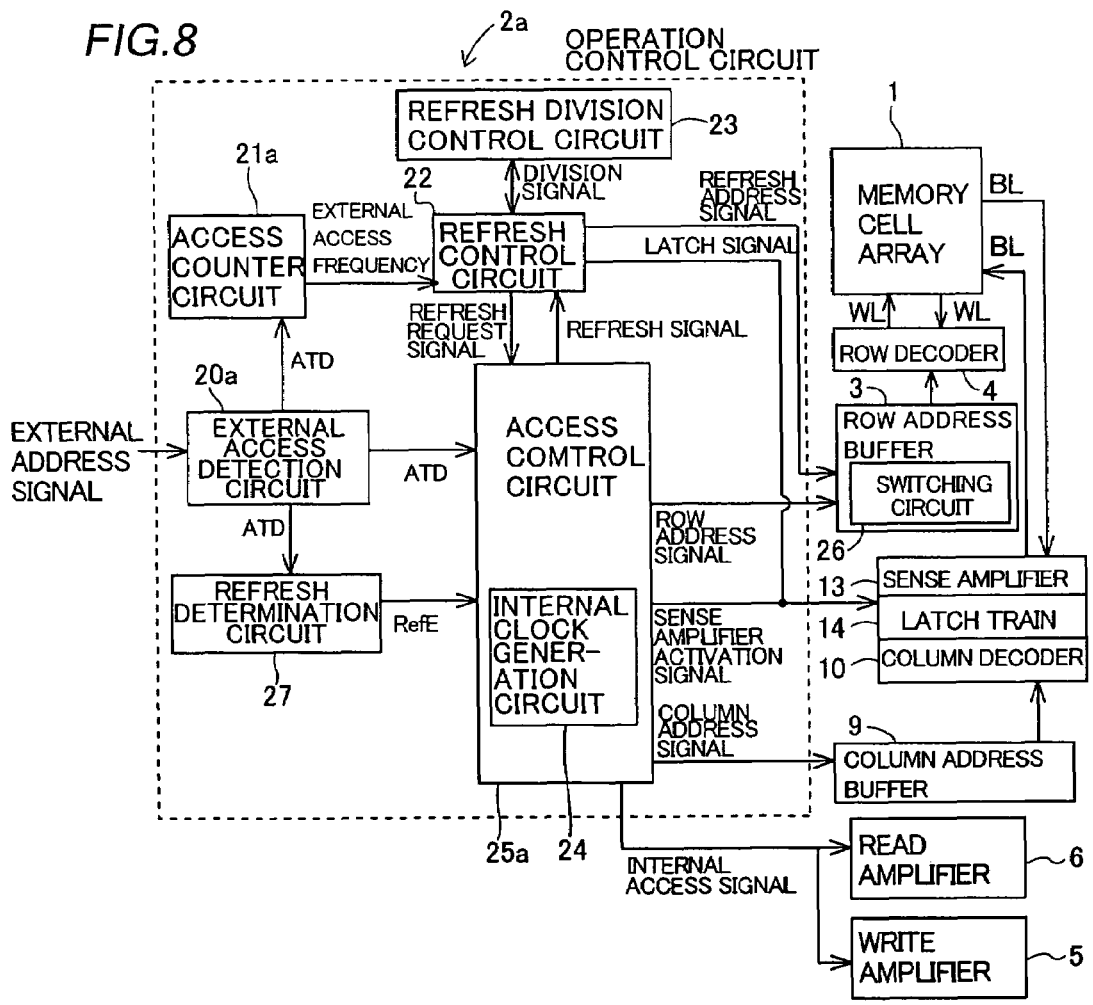

MEMORY

BACKGROUND OF THE INVENTION

1. Field of the Invention

The present invention relates to a memory, and more particularly, it relates to a memory refreshing stored data.

2. Description of the Background Art

A ferroelectric memory (FeRAM: ferroelectric random-access memory) is generally known as an exemplary non-volatile memory. The ferroelectric memory utilizes pseudo-capacitance change responsive to the direction of polarization of a ferroelectric substance as a memory element. Simple matrix and one-transistor ferroelectric memories causing disturbance of data stored in memory cells are known as such ferroelectric memories. In other words, it is known that each of the simple matrix one-transistor ferroelectric memories causes the so-called disturbance in which data are lost due to reduced quantities of polarization of ferroelectric capacitors resulting from application of a prescribed voltage to memory cells connected to word lines other than a selected word line in a rewrite operation after a read operation and a write operation on memory cells including ferroelectric capacitors. In order to suppress such disturbance, each of the simple matrix and one-transistor ferroelectric memories performs a refresh operation.

In relation to a memory performing a refresh operation, various techniques have been proposed in order to perform the refresh operation uncompetitively with an internal access operation. For example, Japanese Patent Laying-Open No. 2001-229674 discloses a DRAM (dynamic random-access memory) performing an internal access operation (read or write operation) in synchronization with an internal clock having a shorter cycle than an external clock having a prescribed cycle. In general, a DRAM must perform a refresh operation upon a lapse of a constant period. In the DRAM disclosed in Japanese Patent Laying-Open No. 2001-229674, the number of internal clocks generated in a constant period is larger than the number of external clocks input in the constant period since the cycle of the internal clock is shorter than that of the external clock. Therefore, the internal clock is periodically generated also when no external access operation is performed in synchronization with the external clock, to result in periodic generation of an internal clock irrelevant to an internal access operation corresponding to an external access operation. The DRAM disclosed in Japanese Patent Laying-Open No. 2001-229674 is so formed as to perform a refresh operation consisting of a read operation and a rewrite operation in synchronization with this internal clock irrelevant to an internal access operation. Thus, the DRAM can perform the refresh operation without hindering any internal access operation.

However, the conventional DRAM disclosed in Japanese Patent Laying-Open No. 2001-229674 performs the refresh operation by continuously performing the read operation and the rewrite operation in synchronization with the internal clock having the cycle shorter by a prescribed ratio than that of the external clock, and hence the cycle of the internal clock is disadvantageously increased. Thus, the cycle of the external clock longer than that of the internal clock must also be increased, to disadvantageously result in a long period of the external access operation.

SUMMARY OF THE INVENTION

The present invention has been proposed in order to solve the aforementioned problem, and an object of the present invention is to provide a memory allowing reduction of the period of an external access operation.

A memory according to an aspect of the present invention comprises an access control portion performing an internal access operation on the basis of an external access operation, a refresh control portion performing a refresh operation and a refresh division control portion dividing the refresh operation into a read operation and a rewrite operation, for performing the read operation and the rewrite operation at least either before or after different internal access operations corresponding to different external access operations respectively.

The memory according to this aspect of the present invention, provided with the refresh division control portion dividing the refresh operation into the read operation and the rewrite operation for performing the read operation and the rewrite operation at least either before or after different internal access operations corresponding to different external access operations respectively as hereinabove described, can reduce the period of the refresh operation performed in the period of a single external access operation as compared with a case of continuously performing the read and rewrite operations of the refresh operation, thereby allowing reduction of the period of the external access operation. Consequently, the memory can improve the data transfer rate.

In the memory according to the aforementioned aspect, the refresh division control portion preferably divides the rewrite operation into a first rewrite operation for writing first data and a second rewrite operation for writing second data, and the memory performs the read operation, the first rewrite operation and the second rewrite operation at least either before or after different internal access operations corresponding to different external access operations respectively. When the refresh division control portion further divides the rewrite operation into the first and second rewrite operations, the memory can further reduce the period of the rewrite operation (refresh operation) performed in the period of a single external access operation, thereby allowing further reduction of the period of the external access operation. Consequently, the memory can further improve the data transfer rate.

The memory according to the aforementioned aspect preferably further comprises a latch portion holding data read by the read operation of the refresh operation. According to this structure, the latch portion can hold the data read through the read operation of the refresh operation without losing the data, whereby the memory can restore and rewrite the data held in the latch portion in the rewrite operation of the refresh operation despite the division of the refresh operation into the read operation and the rewrite operation.

The memory according to the aforementioned aspect preferably further comprises an external access detection portion detecting the external access operation and a refresh determination portion determining whether or not to perform the refresh operation on the basis of detection of the external access operation by the external access detection portion and the operating state of the access control portion, and the access control portion preferably performs the refresh operation at least either before or after the internal access operation on the basis of the result of determination of the refresh determination portion. Thus, the refresh determination portion, provided on the memory for determining whether or not to perform the refresh operation on the basis of detection of the external access operation by the external access detection portion and the operating state of the access control portion, can determine whether or not to perform the refresh operation on the basis of the operating state of the access control portion upon the external access operation also when the external access operation is not periodically performed. Therefore, the memory can perform the divided refresh operation uncompetitively with the internal access operation on the basis of the determination of the refresh determination portion not only when the memory is subjected to a periodically performed external access operation but also when the memory is subjected to an aperiodically performed external access operation.

In the aforementioned memory comprising the external access detection portion and the refresh determination portion, the refresh determination portion preferably outputs a signal for the refresh operation if the access control portion performs neither internal access operation nor refresh operation when the external access detection portion detects the external access operation. According to this structure, an internal access operation and a refresh operation corresponding to a precedent external access operation have been terminated if the access control portion performs neither internal access operation nor refresh operation when the external access detection portion detects the external access operation, whereby the memory can initiate the internal access operation or the refresh operation corresponding to the external access operation substantially simultaneously with detection of the external access operation. Thus, the memory performs the refresh operation when the same can initiate the internal access operation or the refresh operation substantially simultaneously with detection of the external access operation, thereby reducing such a possibility that the internal access operation or the refresh operation continues until after initiation of a subsequent external access operation. Therefore, the memory can suppress a delay in the period for initiating an internal access operation or a refresh operation for the subsequent external access operation caused by continuation of the internal access operation or the refresh operation until after initiation of the subsequent external access operation.

In the aforementioned memory comprising the access detection portion an the refresh determination portion, the access control portion preferably performs the internal access operation after termination of the internal access operation or the refresh operation if performing the internal access operation or the refresh operation when the external access detection portion detects the external access operation. According to this structure, the memory can prevent the access control portion from simultaneously performing the refresh operation and the internal access operation, thereby easily suppressing competition between the refresh operation and the internal access operation.

The memory according to the aforementioned aspect preferably further comprises an external access counter portion counting the access frequency of the external access operation, and the access control portion preferably performs the refresh operation on the basis of the access frequency counted by the external access counter portion. According to this structure, the memory can perform the refresh operation suitable for a ferroelectric memory or the like whose data is deteriorated by a constant frequency of external access operations when external access operations are performed by a constant frequency less than a frequency resulting in disturbance.

The memory according to the aforementioned aspect preferably performs the refresh operation regardless of the access frequency of the external access operation. According to this structure, the frequency of the refresh operation can be so increased that the memory can further suppress disturbance. Further, the memory may not be provided with a structure for counting the access frequency of the external access operation, whereby the circuit structure of the memory can be simplified.

The memory according to the aforementioned aspect preferably further comprises a bit line and a word line arranged to intersect with each other and a memory cell arranged on the intersectional position between the bit line and the word line, and the internal access operation preferably includes a read operation, a rewrite operation and an additional cycle for applying a voltage to the word line and the bit line for canceling potential difference applied to a selected memory cell in the read operation and the rewrite operation of the internal access operation when the memory performs no refresh operation. According to this structure, the memory can cancel the voltage applied to the memory cell every internal access operation, thereby preventing an imprint caused when the sum of all voltages applied to the memory cell is not "0". The term "imprint" denotes such a phenomenon that a hysteresis loop of a ferroelectric substance shifts to the direction of voltage application to cause difficulty in writing of reverse data upon application of a constant-directional voltage to the ferroelectric substance constituting a memory cell.

In the memory according to the aforementioned aspect, the rewrite operation of the refresh operation preferably includes a first rewrite operation for writing first data and a second rewrite operation for writing second data, and the memory preferably performs the read operation of the refresh operation at least either before or after a first internal access operation corresponding to a first external access operation and performs the first rewrite operation and the second rewrite operation of the refresh operation at least either before or after a second internal access operation corresponding to a second external access operation. According to this structure, the memory can perform a single refresh operation in the period of two external access operations when the refresh operation is constituted of three cycles formed by the read operation, the first rewrite operation and the second rewrite operation. Thus, the memory can complete the refresh operation, constituted of the three cycles formed by the read operation, the first rewrite operation and the second rewrite operation, in an earlier stage as compared with a case of performing a single refresh operation in the period of three external access operations. Consequently, the memory can efficiently suppress accumulation of disturbance.

The memory according to the aforementioned aspect preferably further comprises a plurality of memory cell blocks each including a plurality of word lines, for performing the refresh operation on the word lines included in each of at least two of the plurality of memory cell blocks when performing the refresh operation along with the internal access operation in the period of a prescribed external access operation. According to this structure, the memory parallelly refreshes at least two word lines in the period of the prescribed external access operation, thereby completing the refresh operation in an earlier stage as compared with a case of refreshing only a single word line in the period of the prescribed external access operation. Consequently, the memory can easily efficiently suppress accumulation of disturbance.

The aforementioned memory comprising the plurality of memory cell blocks preferably activates the word lines included in each of at least two memory cell blocks subjected to the refresh operation at different rise timings when performing the refresh operation along with the internal access operation in the period of the prescribed external access operation. According to this structure, the memory can deviate the periods of activated states of at least two word lines from each other, thereby reducing the period of simultaneously activating at least two word lines. Thus, the memory can reduce the peaking time of an operating current, thereby reducing noise caused on a power supply line. Consequently, the memory can be improved in operational reliability.

In this case, the memory preferably further comprises a delay circuit. According to this structure, the memory can easily activate word lines included in at least two memory cell blocks subjected to the refresh operation at different rise timings respectively with the delay circuit.

In the memory according to the aforementioned aspect, the access control portion preferably includes an internal clock generation portion. According to this structure, the internal clock generation portion can easily generate an internal clock having a cycle shorter than the period of the internal access operation for performing the divided refresh operation.

In the memory according to the aforementioned aspect, the refresh division control portion preferably divides the rewrite operation into a first rewrite operation for writing first data and a second rewrite operation for writing second data, and the memory performs the divided refresh operation every time the external access operation is performed a prescribed number of times. According to this structure, the memory can suppress disturbance while suppressing increase of power consumption resulting from the refresh operation.

The memory according to the aforementioned aspect preferably further comprises a bit line and a word line arranged to intersect with each other and a memory cell arranged on the intersectional position between the bit line and the word line, while the refresh division control portion preferably divides the rewrite operation into a first rewrite operation for writing first data and a second rewrite operation for writing second data and the access control portion preferably adds an additional cycle for applying a voltage to the word line and the bit line for canceling potential difference applied to a selected memory cell in the refresh operation to the internal access operation. According to this structure, the memory can cancel the voltage applied to the memory cell, thereby preventing an imprint caused when the sum of all voltages applied to the memory cell is not "0".

The memory according to the aforementioned aspect preferably further comprises a word line and a bit line arranged to intersect with each other and a memory cell arranged to be linked to at least the word line, and collectively performs the refresh operation on the memory cell linked to the word line every word line. According to this structure, the memory can reduce the frequency of the refresh operation as compared with a case of performing the refresh operation one by one on individual memory cells.

The memory according to the aforementioned aspect preferably further comprises a switching portion switching a row address signal corresponding to an internal address signal for the internal access operation and another row address signal corresponding to a refresh address signal for the refresh operation. According to this structure, the switching portion can easily switch the row address signals for the internal access operation and the refresh operation and supply the same to the row decoder.

In the memory according to the aforementioned aspect, the internal access operation preferably includes a data read operation and a data rewrite operation as well as a data write operation. According to this structure, the memory can perform the read and rewrite operations of the refresh operation similarly to the read and rewrite operations of the internal access operation, whereby control of the refresh operation can be simplified.

The memory according to the aforementioned aspect may perform the read operation and the rewrite operation after different internal access operations corresponding to different external access operations respectively.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a voltage waveform diagram for illustrating a divided refresh operation of the simple matrix ferroelectric memory according to the first embodiment shown in FIG. 1;

FIG. 8 is a block diagram for illustrating the structure of an operation control circuit of a simple matrix ferroelectric memory according to a second embodiment of the present invention;

DESCRIPTION OF THE PREFERRED EMBODIMENTS

Embodiments of the present invention are now described with reference to the drawings. Each of the following embodiments is described with reference to a simple matrix ferroelectric memory having memory cells formed by only single ferroelectric capacitors arranged on the intersectional positions between corresponding word lines and corresponding bit lines respectively.

First Embodiment

Figure 1:
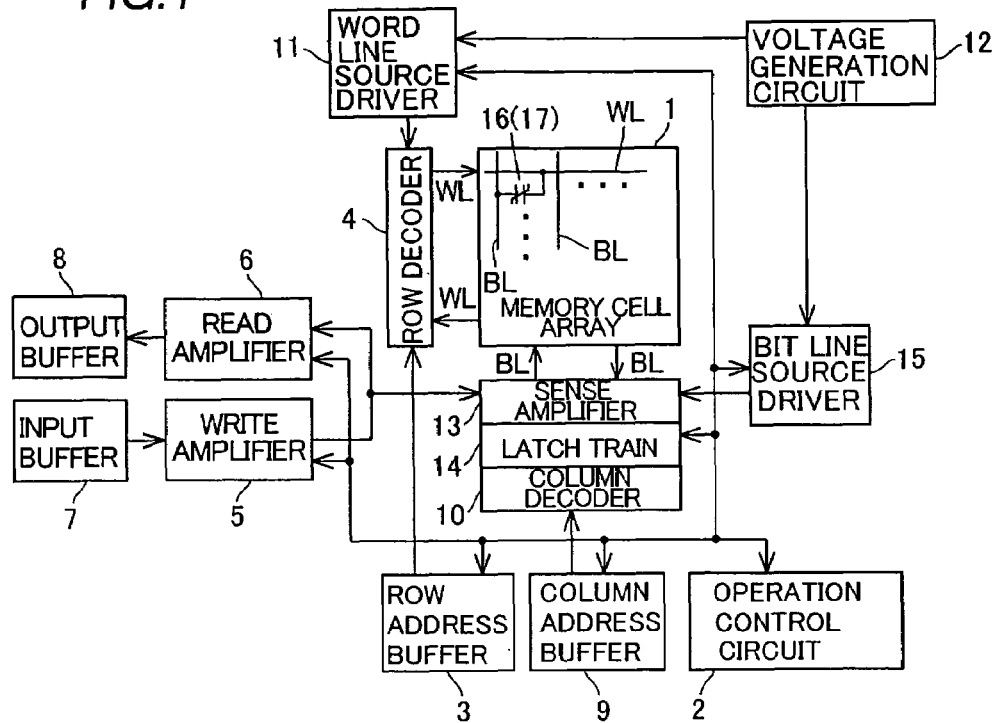
FIG. 1 is a block diagram showing the overall structure of a simple matrix ferroelectric memory according to a first embodiment of the present invention.

The structure of a simple matrix ferroelectric memory according to a first embodiment of the present invention is now described with reference to FIGS. 1 to 3.

The simple matrix ferroelectric memory according to the first embodiment comprises a memory cell array 1, an operation control circuit 2, a row address buffer 3, a row decoder 4, a write amplifier 5, a read amplifier 6, an input buffer 7, an output buffer 8, a column address buffer 9, a column decoder 10, a word line source driver 11, a voltage generation circuit 12, a sense amplifier 13, a latch train 14 and a bit line source driver 15. The latch train 14 is an example of the "latch portion" in the present invention.

Figure 2:
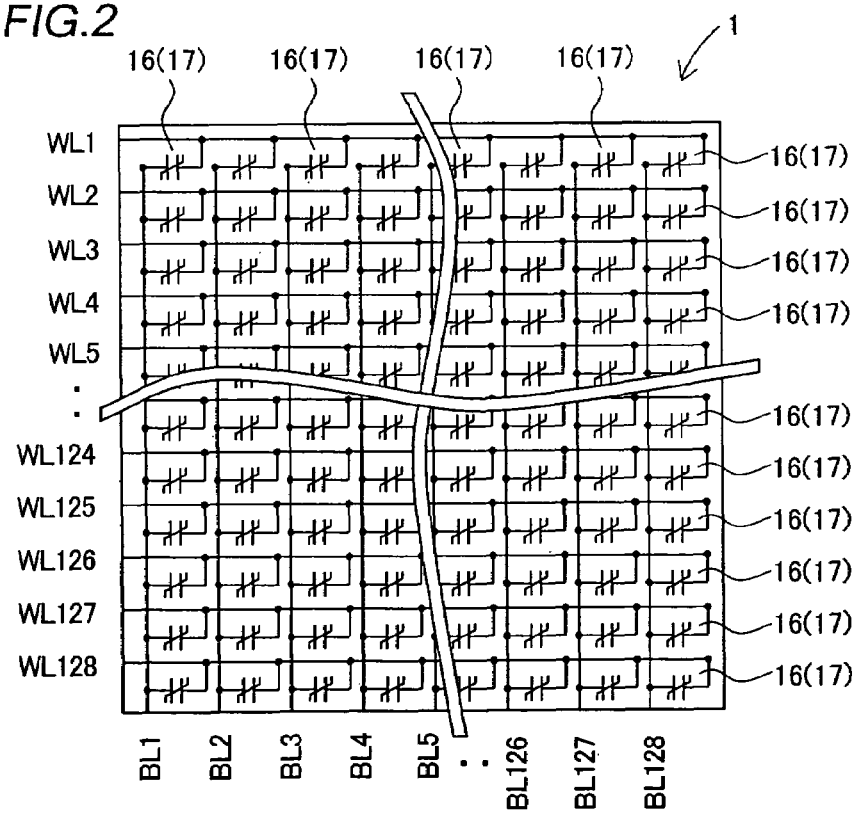
FIG. 2 is a schematic diagram for illustrating the structure of a memory cell array of the simple matrix ferroelectric memory according to the first embodiment shown in FIG. 1.

As shown in FIG. 2, 128 word lines WL and 128 bit lines BL, for example, are arranged on the memory cell array 1 to intersect with each other, while memory cells 17 formed by only single ferroelectric capacitors 16 are arranged on the intersectional positions between the word lines WL and the bit lines BL in the form of a matrix. The ferroelectric capacitors 16 include the corresponding word lines WL, the corresponding bit lines BL and ferroelectric films (not shown) arranged between the word lines WL and the bit lines BL. The row decoder 4 is connected to the word lines WL, and the row address buffer 3 is connected to the row decoder 4.

According to the first embodiment, the operation control circuit 2 is provided for controlling internal access operations and refresh operations for data of the memory cells 17. As shown in FIG. 3, the operation control circuit 2 includes an external access detection circuit 20, an access counter circuit (counter) 21, a refresh control circuit 22, a refresh division control circuit 23 and an access control circuit 25 having an internal clock generation circuit 24. The external access detection circuit 20, the access counter circuit 21, the refresh control circuit 22, the refresh division control circuit 23, the internal clock generation circuit 24 and the access control circuit 25 are examples of the "external access detection portion", the "external access counter portion", the "refresh control portion", the "refresh division control portion", the "internal clock generation portion" and the "access control portion" in the present invention respectively.

The external access detection circuit 20 has a function of outputting an external access detection pulse CMD to the access counter circuit (counter) 21 and the access control circuit 25 when receiving an external clock ECLK through an external access operation. The external access detection circuit 20 also receives a command including an external address signal corresponding to an internal address signal for an internal access operation. The access counter circuit 21, reset upon power supply, has a function of counting up an external access frequency by +1 every time the same receives the external access detection pulse CMD from the external access detection circuit 20 and outputting the resulting external access frequency to the refresh control circuit 22.

The refresh control circuit 22 has a function of outputting a refresh request signal to the access control circuit 25 in order to request a refresh operation of the memory cell array 1 when the external access frequency reaches a constant frequency ($10^6$ times, for example). The refresh control circuit 22 also has a function of outputting a refresh address signal for a refresh operation to the row address buffer 3 when receiving a refresh signal from the access control circuit 25. The refresh control circuit 22 further has a function of outputting a latch signal requesting first and second rewrite operations RFRS1 and RFRS2 to the latch train 14. The access control circuit 25 has a function of outputting a sense amplifier activation signal for activating the sense amplifier 13 to the sense amplifier 13. The refresh division control circuit 23 has a function of dividing the refresh operation into a read operation RFRD, the first rewrite operation RFRS1 and the second rewrite operation RFRS2 and outputting a division signal requesting any of these operations to the refresh control circuit 22.

The access control circuit 25 also has a function of generating an internal clock ICLK for an internal access operation with the internal clock generation circuit 24 when receiving the external access detection pulse CMD from the external access detection circuit 20. The access control circuit 25 further has a function of generating another internal clock ICLK2 for the divided refresh operation with the internal clock generation circuit 24 when performing the refresh operation after termination of the internal access operation. The cycle (50 nsec., for example) of the external clock ECLK is set to be longer than the cycle (30 nsec., for example) of the internal clock ICLK1 and the cycle (10 nsec., for example) of the internal clock ICLK2. The cycle of the internal clock ICLK1 is at least in excess of a time for completing the internal access operation. The cycle of the internal clock ICLK2 is set to about ⅓ of the cycle of the internal clock ICLK. The access control circuit 25 further has a function of generating an internal access operation signal for the internal access operation and outputting this internal access operation to the read amplifier 6 and the write amplifier 5. The access control circuit 25 further has a function of outputting a row address signal and a column address signal of the internal address signal for the internal access operation to the row address buffer 3 and the column address buffer 9 respectively. The access control circuit 25 further has a function of outputting a refresh signal to the refresh control circuit 22 when supplied with the refresh request signal from the refresh control circuit 22 upon termination of the internal access operation.

The row address buffer 3 is provided for supplying a prescribed row address signal corresponding to the row address signal of the internal address signal transmitted from the access control circuit 25 and the refresh address signal transmitted from the refresh control circuit 22 to the row decoder 4. The row decoder 4 is so formed as to activate the word line WL corresponding to the prescribed row address signal supplied from the row address buffer 3 in the internal access operation and the refresh operation. The row address buffer 3 includes a switching circuit 26. Thus, the row address buffer 3 is enabled to switch a row address signal corresponding to the internal address signal for the internal access operation and another row address signal corresponding to the refresh address signal for the refresh operation and supply the same to the row decoder 4. The switching circuit 26 is an example of the "switching portion" in the present invention.

The input buffer 7 and the output buffer 8 are connected to the write amplifier 5 and the read amplifier 6 respectively. The column decoder 10 is connected to the column address buffer 9. The word line source driver 11 is connected to the row decoder 4. The voltage generation circuit 12 and the operation control circuit 2 are connected to the word line source driver 11. The column decoder 10 is connected to the bit lines BL of the memory cell array 1 through the sense amplifier 13. The write amplifier 5, the read amplifier 6 and the bit line source driver 15 are connected to the sense amplifier 13, while the voltage generation circuit 12 is connected to the bit line source driver 15.

Operations of the simple matrix ferroelectric memory according to the first embodiment of the present invention are now described with reference to FIGS. 1 to 7. In the following description, it is assumed that the external access frequency counted by the access counter circuit 21 has reached the prescribed frequency ($10^6$ times, for example) allowing suppression of data disturbance by refreshment in an external access operation preceding an external access operation A shown in FIG. 4 and the refresh control circuit 22 outputs a refresh request signal to the access control circuit 25.

Figure 3:
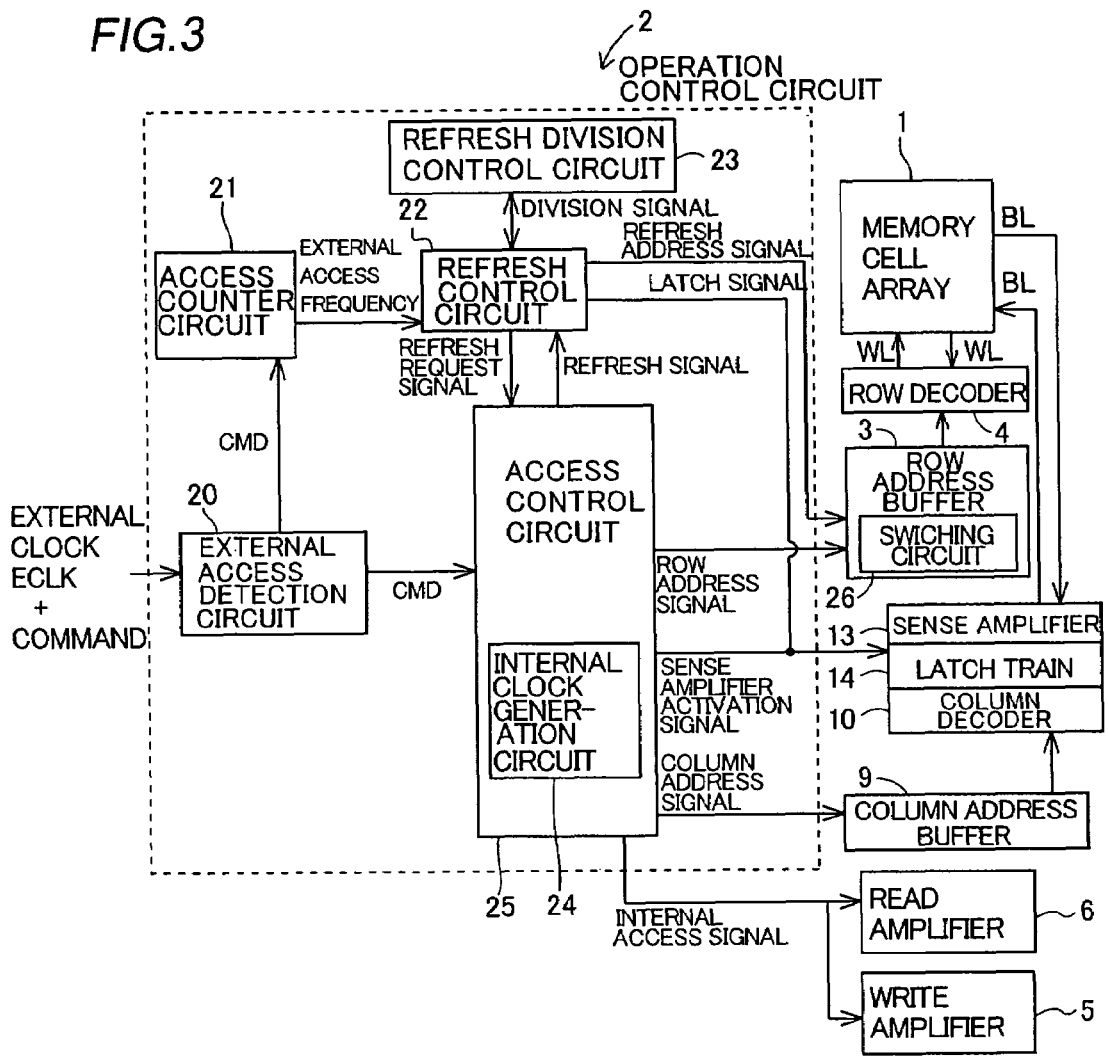
FIG. 3 is a block diagram for illustrating the structure of an operation control circuit of the simple matrix ferroelectric memory according to the first embodiment shown in FIG. 1.
Figure 4:
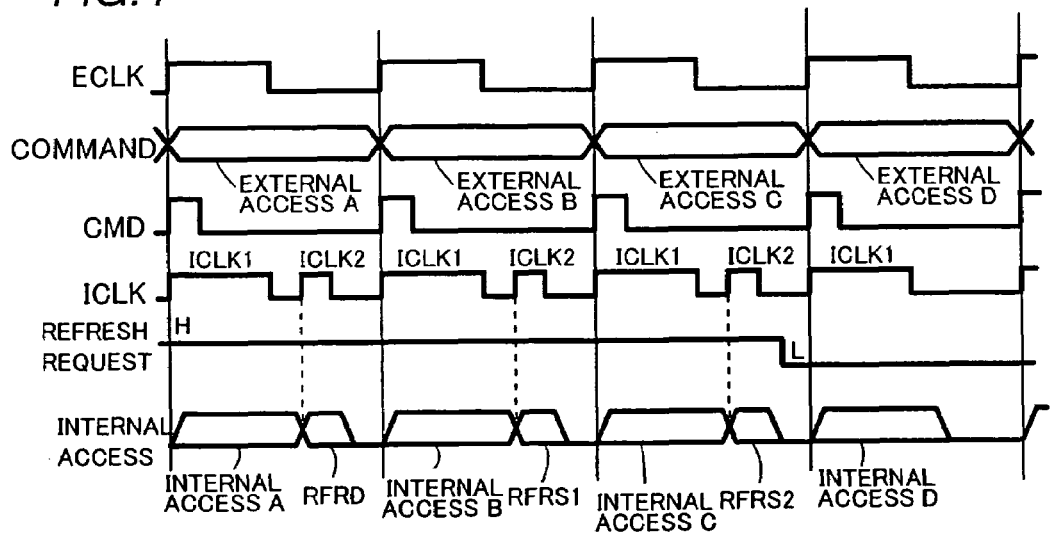
FIG. 4 is a voltage waveform diagram for illustrating operations of the simple matrix ferroelectric memory according to the first embodiment shown in FIG. 1.

When detecting an external clock ECLK for the external access operation A, the external access detection circuit 20 generates an external access detection pulse CMD and supplies this external access detection pulse CMD to the access counter circuit 21 and the access control circuit 25, as shown in FIGS. 3 and 4. When supplied with the external access detection pulse CMD upon detection of the external access operation A, the access counter circuit 21 counts up the external access frequency by +1 and supplies data of the resulting external access frequency to the refresh control circuit 22.

When supplied with the external access detection pulse CMD upon detection of the external access operation A, the access control circuit 25 generates an internal clock ICLK1 having the cycle (30 nsec., for example) shorter than the period (60 nsec., for example) of the external access operation A with the internal clock generation circuit 24. Then, the access control circuit 25 performs an internal access operation A in this cycle of the internal clock ICLK1.

In this internal access operation A, the access control circuit 25 supplies a row address signal of an internal address signal to the row address buffer 3, which in turn supplies the received row address signal of the internal address signal to the row decoder 4. In the internal access operation A, further, the access control circuit 25 supplies a column address signal of the internal address signal to the column address buffer 9, which in turn supplies the received column address signal of the internal address signal to the column decoder 10.

Figure 5:
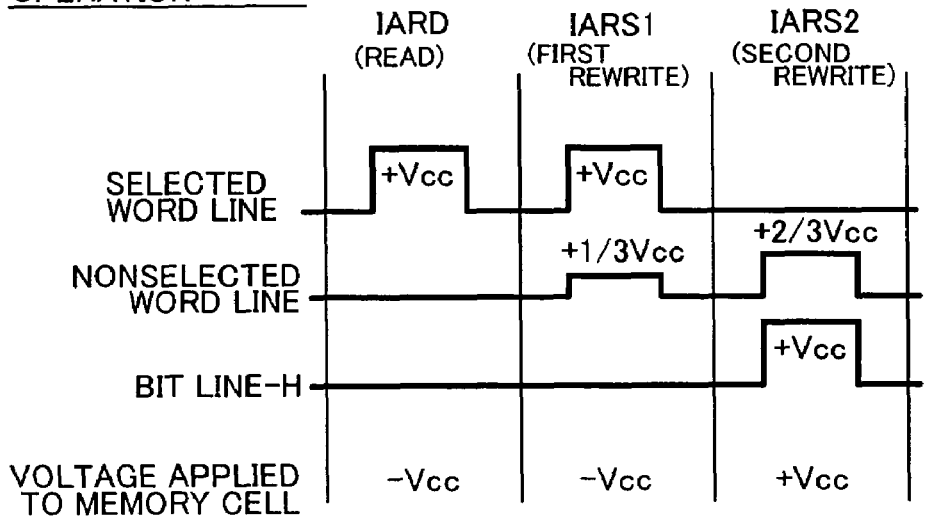
FIGS. 5 and 6 are voltage waveform diagrams for illustrating an internal access operation of the simple matrix ferroelectric memory according to the first embodiment shown in FIG. 1.
Figure 6:
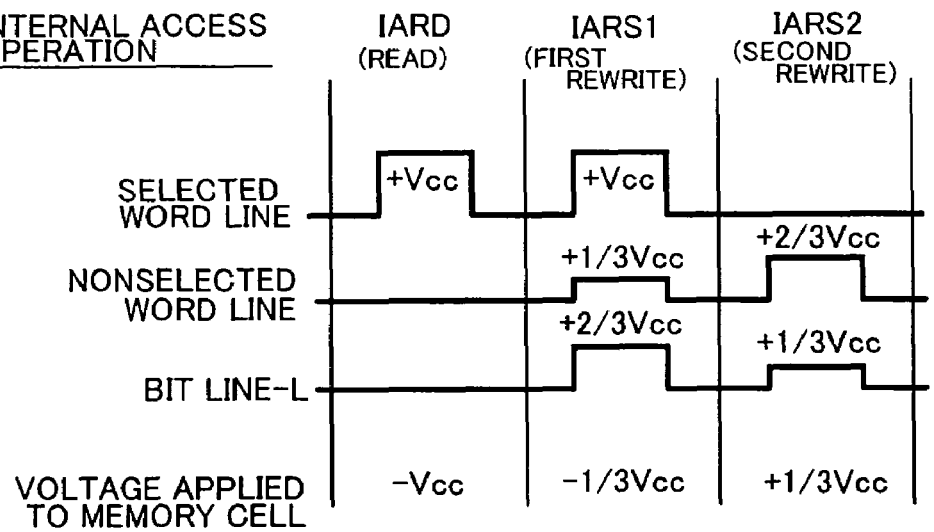

When the internal access operation A is a read operation, the ferroelectric memory continuously performs three cycles formed by a divided read operation IARD, a first rewrite operation IARS1 and a second rewrite operation IARS2, as shown in FIGS. 5 and 6. More specifically, the ferroelectric memory applies a voltage +Vcc to a selected word line WL corresponding to the row address signal of the internal address signal while applying no voltage to the bit lines BL thereby collectively reading data stored in all memory cells 17 linked to the selected word line WL through the corresponding bit lines BL with the sense amplifier 13, as shown in FIGS. 5 and 6.

Then, the ferroelectric memory applies the voltage +Vcc to the memory cells 17, from which data "H" have been read, among those linked to the selected word line WL while applying no voltage to the bit lines BL thereby writing data "L" in these memory cells 17 in the first rewrite operation IARS1, as shown in FIG. 5. Thereafter the ferroelectric memory applies the voltage +Vcc to the bit lines BL from which data "H" have been read while applying no voltage to the selected word line WL thereby writing data "H" in the memory cells 17 in the second rewrite operation IARS2. In the first rewrite operation IARS1 on the memory cells 17 from which data "H" have been read, the ferroelectric memory applies a voltage +⅓Vcc to nonselected word lines WL while applying no voltage to the bit lines BL from which data "H" have been read. Thus, the ferroelectric memory applies a voltage −⅓Vcc to the memory cells 17 connected to the nonselected word lines WL and the bit lines BL from which data "H" have been read in the first rewrite operation IARS1. In the second rewrite operation IARS2, the ferroelectric memory applies a voltage +⅔Vcc to the nonselected word lines WL while applying the voltage +Vcc to the bit lines BL from which data "H" have been read. Thus, the ferroelectric memory applies the voltage +⅓Vcc to the memory cells 17 connected to the nonselected word lines WL and the bit lines BL from which data "H" have been read in the second rewrite operation IARS2. Therefore, the ferroelectric memory applies no voltage exceeding ⅓Vcc to the memory cells 17 connected to the nonselected word lines WL and the bit lines BL from which data "H" have been read as an absolute value, while applying the voltages −⅓Vcc and +⅓Vcc generated in the first and second rewrite operations IARS1 and IARS2 respectively to cancel each other.

On the other hand, the ferroelectric memory has read data from and written data "L" in the memory cells 17 from which data "L" have been read among those linked to the selected word line WL through the aforementioned read operation IARD, as shown in FIG. 6. Therefore, the ferroelectric memory so performs the first and second rewrite operations IARS1 and IARS2 as not to apply a voltage exceeding ⅓Vcc to the selected word line WL as an absolute value destroying the data "L" written in the memory cells 17. More specifically, the ferroelectric memory applies the voltage +Vcc to the selected word line WL while applying the voltage +⅔Vcc to the bit lines BL from which data "L" have been read in the first rewrite operation IARS1 with respect to the memory cells 17 of the selected word line WL. In the second rewrite operation IARS2, the ferroelectric memory applies no voltage to the selected word line WL while applying the voltage +⅓Vcc to the bit lines BL from which data "L" have been read. In the first rewrite operation IARS1 with respect to the memory cells 17 from which data "L" have been read, the ferroelectric memory applies the voltage +⅓Vcc to the nonselected word lines WL while applying the voltage +⅔Vcc to the bit lines BL from which data "L" have been read. Thus, only the voltage +⅓Vcc appears in the memory cells 17 connected to the nonselected word lines WL and the bit lines BL from which data "L" have been read. In the second rewrite operation IARS2, the ferroelectric memory applies the voltage +⅔Vcc to the nonselected word lines WL while applying the voltage +⅓Vcc to the bit lines BL from which data "L" have been read. Thus, the ferroelectric memory applies the voltage −⅓Vcc to the memory cells 17 connected to the nonselected word lines WL and the bit lines BL from which data "L" have been read in the second rewrite operation IARS2. Therefore, the ferroelectric memory applies no voltage exceeding ⅓Vcc to the memory cells 17 connected to the nonselected word lines WL and the bit line BL from which data "L" have been read as an absolute value, while applying the voltages +⅓Vcc and −⅓Vcc generated in the first and second rewrite operations IARS1 and IARS2 respectively to cancel each other.

When terminating the internal access operation A, the access control circuit 25 supplied with the refresh request signal from the refresh control circuit 22 generates an internal clock ICLK2 for performing a refresh operation after the internal access operation A and outputs a refresh signal to the refresh control circuit 22. Consequently, the ferroelectric memory enters a refresh operation state. It is assumed that this is a 128$^{th}$ refresh operation after the supply of the refresh request signal. In other words, it is assumed that the word lines WL1 to WL127 have already been refreshed and the ferroelectric memory refreshes the final word line WL128.

According to the first embodiment, the ferroelectric memory dividedly performs the refresh operation constituted of the three cycles (the read operation RFRD, the first rewrite operation RFRS1 and the second rewrite operation RFRS2) every cycle. More specifically, the refresh division control circuit 23 outputs a division signal requesting only the read operation RFRD forming the first cycle among the read operation RFRD, the first rewrite operation RFRS1 and the second rewrite operation RFRS2 forming the three cycles of the refresh operation to the refresh control circuit 22 supplied with the refresh signal upon termination of the internal access operation A. Therefore, the refresh control circuit 22 outputs a refresh address signal corresponding to the word line WL128 to the row address buffer 3, in order to perform the read operation RFRD of the refresh operation. In the read operation RFRD of the refresh operation, the ferroelectric memory applies the voltage +Vcc to the word line WL128 while applying no voltage to the bit lines BL, as shown in FIG. 7. Thus, the ferroelectric memory outputs data of the memory cells 17 linked to the word line WL128 to the latch train 14, which in turn holds the received data. Upon termination of the read operation RFRD, the access control circuit 25 enters a standby state up to initiation of a subsequent external access operation B. In other words, only the read operation RFRD forming the first cycle of the three cycles of the refresh operation is performed in the external access operation A, subsequently to the internal access operation A.

When detecting an external clock ECLK for the external access operation B, the external access detection circuit 20 generates an external access detection pulse CMD and supplies this external access detection pulse CMD to the access counter circuit 21 and the access control circuit 25. When supplied with the external access detection pulse CMD upon detection of the external access operation B, the access counter circuit 21 counts up the external access frequency by +1 and supplies data of the resulting external access frequency to the refresh control circuit 22.

When supplied with the external access detection pulse CMD upon detection of the external access operation B, the access control circuit 25 generates an internal clock ICLK1 for one cycle with the internal clock generation circuit 24. Then, the access control circuit 25 performs an internal access operation B in this cycle of the internal clock ICLK1.

When terminating the internal access operation B, the access control circuit 25 supplied with the refresh request signal from the refresh control circuit 22 generates an internal clock ICLK2 for performing a refresh operation after the internal access operation B and outputs a refresh signal to the refresh control circuit 22. Consequently, the ferroelectric memory enters a refresh operation state.

According to the first embodiment, the refresh division control circuit 23 outputs a division signal requesting only the first rewrite operation RFRS1 forming the second cycle among the read operation RFRD, the first rewrite operation RFRS1 and the second rewrite operation RFRS2 forming the three cycles of the refresh operation to the refresh control circuit 22 supplied with the refresh signal upon termination of the internal access operation B. Therefore, the refresh control circuit 22 outputs a refresh address signal corresponding to the word line WL128 to the row address buffer 3, in order to perform the first rewrite operation RFRS1 of the refresh operation. In the first rewrite operation RFRS1 of the refresh operation, the ferroelectric memory applies the voltage +Vcc to the word line WL128 while applying no voltage to the bit lines BL from which data "H" have been read and applying the voltage +⅔Vcc to the bit lines BL from which data "L" have been read, as shown in FIG. 7. Thus, the ferroelectric memory rewrites the data read and held in the latch train 14 through the read operation RFRD. Upon termination of the first rewrite operation RFRS1, the access control circuit 25 enters a standby state up to initiation of a subsequent external access operation C. In other words, only the first rewrite operation RFRS1 forming the second cycle of the three cycles of the refresh operation is performed in the external access operation B, subsequently to the internal access operation B.

When detecting an external clock ECLK for the external access operation C (see FIG. 4), the external access detection circuit 20 generates an external access detection pulse CMD and supplies this external access detection pulse CMD to the access counter circuit 21 and the access control circuit 25. When supplied with the external access detection pulse CMD upon detection of the external access operation C, the access counter circuit 21 counts up the external access frequency by +1 and supplies data of the resulting external access frequency to the refresh control circuit 22.

When supplied with the external access detection pulse CMD upon detection of the external access operation C, the access control circuit 25 generates an internal clock ICLK1 for one cycle with the internal clock generation circuit 24.

Then, the access control circuit 25 performs an internal access operation C in this cycle of the internal clock ICLK1.

When terminating the internal access operation C, the access control circuit 25 supplied with the refresh request signal from the refresh control circuit 22 generates an internal clock ICLK2 for performing a refresh operation after termination of the internal access operation C and outputs a refresh signal to the refresh control circuit 22. Consequently, the ferroelectric memory enters a refresh operation state.

According to the first embodiment, the refresh division control circuit 23 outputs a division signal requesting only the second rewrite operation RFRS2 forming the third cycle among the read operation RFRD, the first rewrite operation RFRS1 and the second rewrite operation RFRS2 forming the three cycles of the refresh operation to the refresh control circuit 22 supplied with the refresh signal upon termination of the internal access operation C. Therefore, the refresh control circuit 22 outputs a refresh address signal corresponding to the word line WL128 to the row address buffer 3, in order to perform the second rewrite operation RFRS2 of the refresh operation. In the second rewrite operation RFRS2 of the refresh operation, the ferroelectric memory applies the voltage +Vcc to the bit lines BL from which data "H" have been read and applies the voltage +⅓Vcc to the bit lines BL from which data "L" have been read while applying no voltage to the word line WL128, as shown in FIG. 7. Thus, the ferroelectric memory rewrites data read and held in the latch train 14 through the read operation RFRD. In other words, only the second rewrite operation RFRS2 forming the third cycle among the three cycles of the refresh operation is performed in the external access operation C, subsequently to the internal access operation C. Upon termination of the second rewrite operation RFRS2, the refresh control circuit 22 steps down the refresh request signal to a low level since the ferroelectric memory has refreshed all of the word lines WL1 to WL128. Thereafter the access control circuit 25 enters a standby state up to initiation of a subsequent external access operation D.

When detecting an external clock ECLK for the external access operation D (see FIG. 4), the external access detection circuit 20 generates an external access detection pulse CMD and supplies this external access detection pulse CMD to the access counter circuit 21 and the access control circuit 25. When supplied with the external access detection pulse CMD upon detection of the external access operation D, the access counter circuit 21 counts up the external access frequency by +1 and supplies data of the resulting external access frequency to the refresh control circuit 22.

When supplied with the external access detection pulse CMD upon detection of the external access operation D, the access control circuit 25 generates an internal clock ICLK1 for one cycle with the internal clock generation circuit 24. Then, the access control circuit 25 performs an internal access operation D in this cycle of the internal clock ICLK1. When terminating the internal access operation D, the access control circuit 25, supplied with no refresh request signal from the refresh control circuit 22, enters a standby state up to initiation of a subsequent external access operation without a refresh operation.

Thereafter the ferroelectric memory repeats only the internal access operation without performing the refresh operation. When external access operations are performed by a prescribed frequency ($10^6$ times, for example) from initiation of the refresh operation responsive to the precedent refresh request signal, the refresh control circuit 22 supplies a refresh request signal to the access control circuit 25 on the basis of the external access frequency supplied by the access counter circuit 21. Then, the ferroelectric memory performs a refresh operation divided into three cycles on all word lines WL1 to WL128 again.

According to the first embodiment, as hereinabove described, the ferroelectric memory provided with the refresh division control circuit 23 dividing the refresh operation into the read operation RFRD, the first rewrite operation RFRS1 and the second rewrite operation RFRS2 for performing the read operation RFRD, the first rewrite operation RFRS1 and the second rewrite operation RFRS2 after different internal access operations corresponding to different external access operations respectively can reduce the period of the refresh operation performed in the period of each external access operation as compared with a case of continuously performing the read and write operations of the refresh operation, whereby the period of the external access operation (cycle of the external clock ECLK) can be reduced. Consequently, the ferroelectric memory can improve the data transfer rate.

According to the first embodiment, the ferroelectric memory provided with the latch train 14 for holding data read through the read operation RFRD of the refresh operation without losing the same can restore and rewrite the data held in the latch train 14 in the subsequent first and second rewrite operations RFRS1 and RFRS2 of the refresh operation despite the division of the refresh operation into the read operation RFRD and the first and second rewrite operations RFRS1 and RFRS2. Further, the ferroelectric memory provided with the access counter circuit 21 for performing the refresh operation when the external access operation is performed by a constant frequency smaller than that causing disturbance allows a refresh operation suitable to a simple matrix ferroelectric memory, such as that according to the first embodiment, whose data are deteriorated by a constant frequency of external access operations. In the memory cells 17 connected to the nonselected word lines WL, voltages caused in the first and second rewrite operations IARS1 and IARS2 respectively cancel each other, whereby the ferroelectric memory can suppress data deterioration in the memory cells 17 connected to the nonselected word lines WL through the internal access operation.

Second Embodiment

Referring to FIG. 8, a second embodiment of the present invention is applied to a simple matrix ferroelectric memory subjected to aperiodic external access operations, dissimilarly to the aforementioned first embodiment.

In the ferroelectric memory according to the second embodiment, an operation control circuit 2a includes an external access detection circuit 20a, an access counter circuit (counter) 21a, a refresh control circuit 22, a refresh division control circuit 23, an access control circuit 25a having an internal clock generation circuit 24 and a refresh determination circuit 27, as shown in FIG. 8. The external access determination circuit 20a, the access counter circuit 21a, the access control circuit 25a and the refresh determination circuit 27 are examples of the "external access determination portion", the "external access counter portion", the "access control portion" and the "refresh determination portion" in the present invention respectively. The external access detection circuit 20a has a function of outputting an external access detection pulse ATD to the access counter circuit 21a, the access control circuit 25a and the refresh determination circuit 27 when supplied with an external address signal for an external access operation. The access counter circuit 21a, reset upon power supply, has a function of counting up an external access frequency by +1 every time the same receives the external access detection pulse ATD from the external access detection circuit 20a and outputting the resulting external access frequency to the refresh control circuit 22. The access control circuit 25a has a function of generating an internal clock ICLK1 with the internal clock generation circuit 24 when receiving the external access detection pulse ATD from the external access detection circuit 20a. The access control circuit 25a also has a function of generating another internal clock ICLK2 for a refresh operation with the internal clock generation circuit 24 when receiving a refresh request signal and a refresh determination signal RefE from the refresh determination circuit 27 for performing a refresh operation after termination of an internal access operation. As to the remaining functions, the access control circuit 25a is similar to the access control circuit 25 according to the first embodiment.

When supplied with the external access detection pulse ATD from the external access detection circuit 20a upon detection of the corresponding external access operation, the refresh determination circuit 27 outputs the refresh determination signal RefE of a high or low level on the basis of the operating state of the access control circuit 25a. The refresh control circuit 22 and the refresh division control circuit 23 are similar in structure to those of the first embodiment. The period (70 nsec., for example) of the shortest cycle of an external address is set to be longer than the cycles (60 nsec. and 20 nsec., for example) of the internal clocks ICLK1 and ICLK2.

The remaining structure of the second embodiment is similar to that of the aforementioned first embodiment.

Operations of the simple matrix ferroelectric memory according to the second embodiment of the present invention are now described with reference to FIGS. 2, 8 and 9. In the following description, it is assumed that the external access frequency counted by the access counter circuit 21a has reached a prescribed frequency ($10^6$ times, for example) allowing suppression of data disturbance by refreshment in an external access operation preceding an external access operation A shown in FIG. 9 and the refresh control circuit 22 outputs a refresh request signal to the access control circuit 25a.

Figure 9:
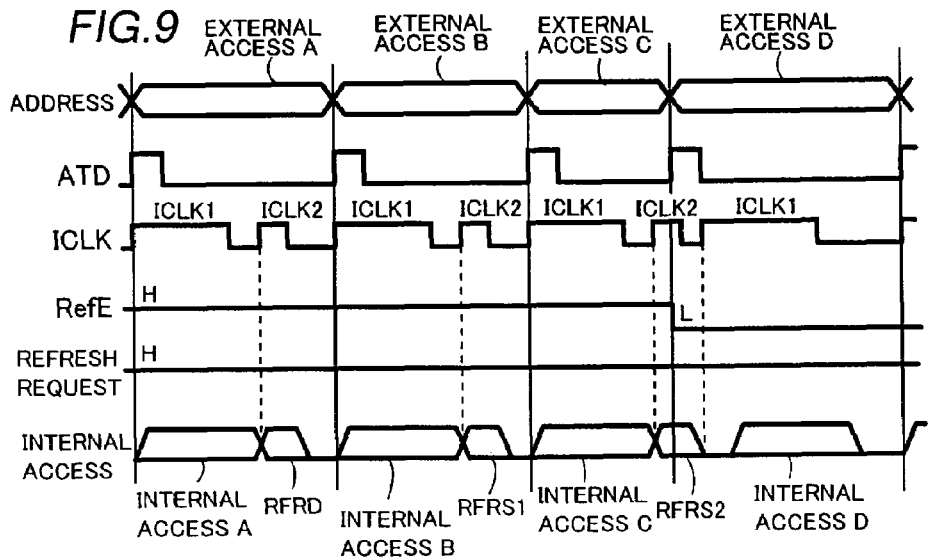
FIG. 9 is a voltage waveform diagram for illustrating operations of the simple matrix ferroelectric memory according to the second embodiment of the present invention.

When detecting an external address signal for the external access operation A, the external access detection circuit 20a generates an external access detection pulse ATD and supplies this external access detection pulse ATD to the access counter circuit 21a, the access control circuit 25a and the refresh determination circuit 27, as shown in FIGS. 8 and 9. When supplied with the external access detection pulse ATD upon detection of the external access operation A, the access counter circuit 21a counts up the external access frequency by +1 and supplies data of the resulting external access frequency to the refresh control circuit 22. When supplied with the external access detection pulse ATD upon detection of the external access operation A, the refresh determination circuit 27 determines whether the access control circuit 25a is in an internal access operation state or in a refresh operation state.

When the access control circuit 25a supplied with the external access detection pulse ATD is neither in an internal access operation state nor in a refresh operation state, the refresh determination circuit 27 steps up the determination signal RefE to a high level, in order to allow the access control circuit 25a to perform a refresh operation during the external access operation A. When the access control circuit 25a supplied with the external access detection pulse ATD from the external access detection circuit 20a is either in an internal access operation state or in a refresh operation state, on the other hand, there is a high possibility that an internal access operation B corresponding to a subsequent external access operation B remarkably delays with respect to the external access operation B if the ferroelectric memory performs a refresh operation during the external access operation A. Therefore, the refresh determination circuit 27 steps down the refresh determination signal RefE to a low level so that the access control circuit 25a performs no refresh operation during the external access operation A.

The access control circuit 25a is neither in an internal access operation state nor in a refresh operation state upon detection of the external access operation A, whereby the refresh determination circuit 27 steps up the refresh determination signal RefE to a high level. The refresh determination circuit 27 holds this refresh determination signal RefE at the high level until the external access detection circuit 20a detects the subsequent external access operation B.

When supplied with the external access detection pulse ATD upon detection of the external access operation A, the access control circuit 25a, neither in an internal access operation state nor in a refresh operation state, generates an internal clock ICLK1, having the cycle (60 nsec., for example) shorter than the shortest period (70 nsec., for example) of the external access operation A, for one cycle. Then, the access control circuit 25a performs an internal access operation A similar to that in the first embodiment in this cycle of the internal clock ICLK1.

Upon termination of the internal access operation A with termination of one cycle of the internal clock ICLK1, the refresh determination signal RefE is held at the high level. Further, the access control circuit 25a is supplied with the refresh request signal from the refresh control circuit 22. Thus, the access control circuit 25a generates an internal clock ICLK2 for a refresh operation for one cycle and supplies a refresh signal to the refresh control circuit 22. Consequently, the ferroelectric memory enters a refresh operation state. The refresh control circuit 22, receiving a division signal requesting only a read operation RFRD forming a first cycle of the refresh operation divided into three cycles from the refresh division control circuit 23, performs the read operation RFRD so that a latch train 14 holds data of a word line WL (word line WL1, for example). The refresh control circuit 22 performs the read operation RFRD similarly to the refresh control circuit 22 according to the aforementioned first embodiment. After termination of the read operation RFRD of the refresh operation, the access control circuit 25a enters a standby state up to initiation of the subsequent external access operation B.

Upon initiation of the subsequent external access operation B, the external access detection circuit 20a detects an external address signal. Thus, the external access detection circuit 20a generates an external access detection pulse ATD and supplies this external access detection pulse ATD to the access counter circuit 21a, the refresh determination circuit 27 and the access control circuit 25a. When supplied with the external access detection pulse ATD upon detection of the external access operation B, the access counter circuit 21a counts up the external access frequency by +1 and supplies data of the resulting external access frequency to the refresh control circuit 22. When supplied with the external access detection pulse ATD upon detection of the external access operation B, the refresh determination circuit 27 determines whether the access control circuit 25a is in an internal access operation state or in a refresh operation state.

The access control circuit 25a performs neither internal access operation nor refresh operation upon detection of the external access operation B, whereby the refresh determination circuit 27 holds the refresh determination signal RefE at the high level.

When supplied with the external access detection pulse ATD upon detection of the external access operation B, the access control circuit 25a, neither in an internal access operation state nor in a refresh operation state, generates an internal clock ICLK1 for the internal access operation B for one cycle with the internal clock generation circuit 24. Then, the access control circuit 25a performs the internal access operation B in this cycle of the internal clock ICLK1. When terminating the internal access operation B, the access control circuit 25a supplied with the refresh request signal from the refresh control circuit 22 along with the refresh determination signal RefE held at the high level generates an internal clock ICLK2 for a refresh operation for one cycle and supplies a refresh signal to the refresh control circuit 22. The refresh control circuit 22, receiving a division signal requesting only a first rewrite operation RFRS1 forming a second cycle in the refresh operation divided into three cycles from the refresh division control circuit 23, performs the first rewrite operation RFRS1. The refresh control circuit 22 performs the rewrite operation RFRS1 similarly to the refresh control circuit 22 according to the first embodiment. Upon termination of the first rewrite operation RFRS1 of the refresh operation, the access control circuit 25a enters a standby state up to initiation of a subsequent external access operation C.

Upon initiation of the external access operation C (see FIG. 9), the external access detection circuit 20a detects an external address signal. Thus, the external access detection circuit 20a generates an external access detection pulse ATD and supplies this external access detection pulse ATD to the access counter circuit 21a, the refresh determination circuit 27 and the access control circuit 25a. When supplied with the external access detection pulse ATD upon detection of the external access operation C, the access counter circuit 21a counts up the external access frequency by +1 and supplies data of the resulting external access frequency to the refresh control circuit 22. When supplied with the external access detection pulse ATD upon detection of the external access operation C, the refresh determination circuit 27 determines whether the access control circuit 25a is in an internal access operation state or in a refresh operation state. The access control circuit 25a performs neither internal access operation nor refresh operation upon detection of the external access operation C, whereby the refresh determination circuit 27 holds the refresh determination signal RefE at the high level.

When supplied with the external access detection pulse ATD upon detection of the external access operation C, the access control circuit 25a, neither in an internal access operation state nor in a refresh operation state, generates an internal clock ICLK1 for an internal access operation C for one cycle with the internal clock generation circuit 24. Then, the access control circuit 25a performs the internal access operation C in this cycle of the internal clock ICLK1. When terminating the internal access operation C, the access control circuit 25a supplied with the refresh request signal from the refresh control circuit 22 along with the refresh determination signal RefE held at the high level generates an internal clock ICLK2 for a refresh operation for one cycle and supplies a refresh signal to the refresh control circuit 22. The refresh control circuit 22, receiving a division signal requesting only a second rewrite operation RFRS2 forming a third cycle in the refresh operation divided into three cycles from the refresh division control circuit 23, performs the second rewrite operation RFRS2. The refresh control circuit 22 performs the second rewrite operation RFRS2 similarly to the refresh control circuit 22 according to the first embodiment.

Upon initiation of a subsequent external access operation D (see FIG. 9), the external access detection circuit 20a detects an external address signal. Thus, the external access detection circuit 20a generates an external access detection pulse ATD and supplies this external access detection pulse ATD to the access counter circuit 21a, the refresh determination circuit 27 and the access control circuit 25a. When supplied with the external access detection pulse ATD, the access counter circuit 21a counts up the external access frequency by +1 and supplies data of the resulting external access frequency to the refresh control circuit 22. When supplied with the external access detection pulse ATD upon detection of the external access operation D, the refresh determination circuit 27 determines whether the access control circuit 25a is in an internal access operation state or in a refresh operation state. The access control circuit 25a performs the second rewrite operation RFRS2 of the refresh operation upon detection of the external access operation D, whereby the refresh determination circuit 27 steps down the refresh determination signal RefE to a low level.

The access control circuit 25a, supplied with the external access detection pulse ATD upon detection of the external access operation D, has not yet terminated the second rewrite operation RFRS2 of the refresh operation initiated in the period of the precedent external access operation C. Therefore, the access control circuit 25a generates no internal clock ICLK1, to perform no internal access operation D. Upon termination of the second rewrite operation RFRS2 initiated in the period of the external access operation C, the access control circuit 25a generates an internal clock ICLK1 for one cycle and initiates an internal access operation D. Then, the access control circuit 25a performs the internal access operation D in this cycle of the internal clock ICLK1. According to the second embodiment, the refresh determination signal RefE remains low upon termination of the internal access operation D with termination of one cycle of the internal clock ICLK1, whereby the access control circuit 25a enters a standby state up to a subsequent external access operation E without a refresh operation.

Thereafter the ferroelectric memory repeats the read operation RFRD and the first and second rewrite operations RFRS1 and RFRS2 of the refresh operation similarly to the above until the same refreshes all of 128 word lines WL1 to WL128 similar to those shown in FIG. 2. The ferroelectric memory terminates the refresh operation by refreshing all word lines WL1 to WL128. Thereafter the ferroelectric memory repeats only the internal access operation. When external access operations are performed by a prescribed frequency ($10^6$ times, for example) from initiation of the refresh operation responsive to the precedent refresh request signal, the refresh control circuit 22 supplies a refresh request signal to the access control circuit 25a on the basis of the external access frequency supplied by the access counter circuit 21a. Then, the ferroelectric memory performs a refresh operation on all word lines WL1 to WL128 again.

According to the second embodiment, as hereinabove described, the ferroelectric memory provided with the refresh determination circuit 27 determining whether or not to perform a refresh operation on the basis of detection of an external access operation with the external access detection circuit 20a and the operating state of the access control circuit 25a can determine whether or not to perform the refresh operation with the refresh determination circuit 27 on the basis of the operating state of the access control circuit 25a when subjected to an aperiodic external access operation. Thus, the ferroelectric memory according to the second embodiment, subjected to an aperiodic external access operation, can perform the divided refresh operation with the access control circuit 25a on the basis of the determination of the refresh determination circuit 27, uncompetitively with the internal access operation.

According to the second embodiment, the access control circuit 25a, having terminated an internal access operation corresponding to a precedent external access operation and a refresh operation when performing neither internal access operation nor refresh operation upon detection of an external access operation, can perform the corresponding internal access operation substantially simultaneously with detection of the external access operation. Thus, the ferroelectric memory can suppress a possibility of continuing any refresh operation until after initiation of a subsequent external access operation.

The remaining effects of the second embodiment are similar to those of the aforementioned first embodiment.

Third Embodiment

Figure 10:
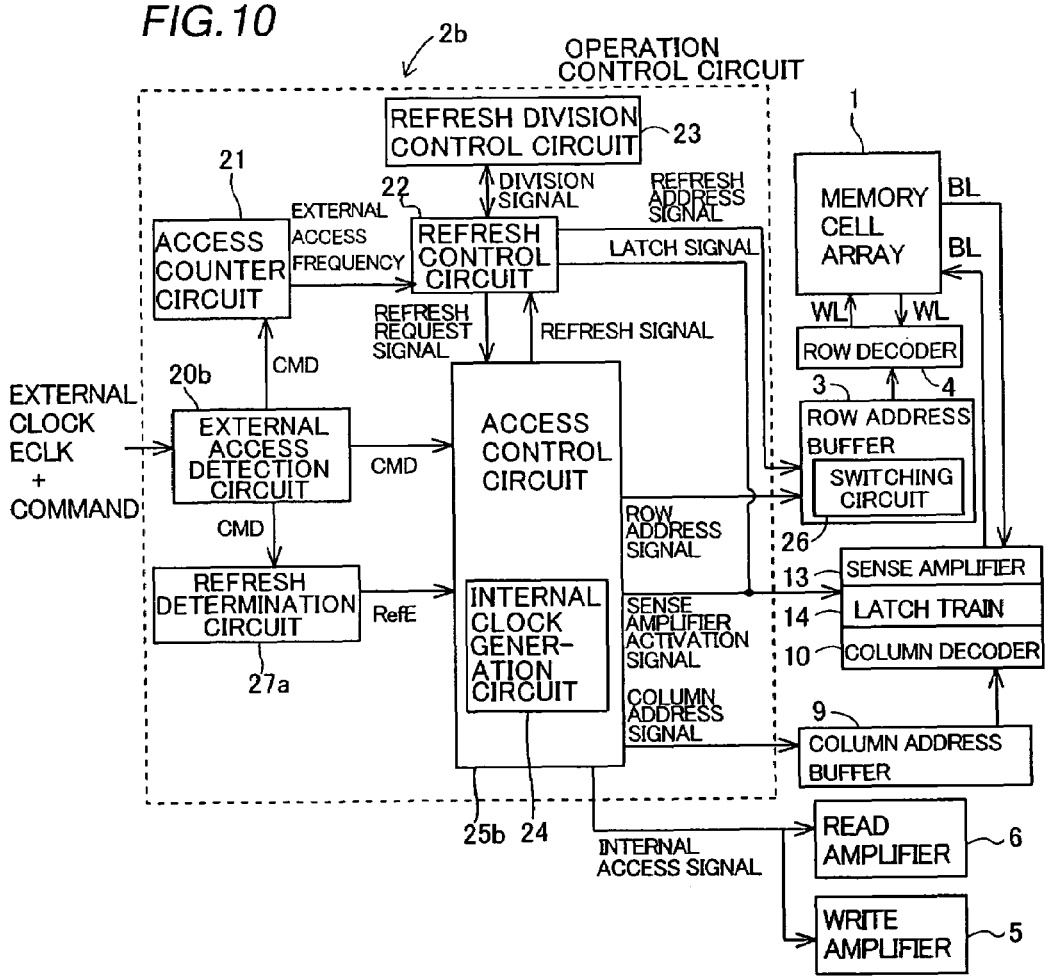
FIG. 10 is a block diagram for illustrating the structure of an operation control circuit of a simple matrix ferroelectric memory according to a third embodiment of the present invention.

Referring to FIG. 10, a third embodiment of the present invention is applied to a simple matrix ferroelectric memory subjected to an external access operation in synchronization with an external clock dissimilarly to the aforementioned second embodiment. According to the third embodiment, the sum of the period (60 nsec., for example) of an internal access operation and the period (20 nsec., for example) of a read operation RFRD and first and second rewrite operations RFRS1 and RFRS2 of a refresh operation is set to be longer than the period (65 nsec., for example) of the external clock, dissimilarly to the aforementioned first embodiment.

In the ferroelectric memory according to the third embodiment, an operation control circuit 2b includes an external access detection circuit 20b, an access counter circuit (counter) 21, a refresh control circuit 22, a refresh division control circuit 23, an access control circuit 25b having an internal clock generation circuit 24 and a refresh determination circuit 27a, as shown in FIG. 10. The external access detection circuit 20b, the access control circuit 25b and the refresh determination circuit 27a are examples of the "external access detection portion", the "access control portion" and the "refresh determination portion" in the present invention respectively. The external access detection circuit 20b has a function of outputting an external access detection pulse CMD to the access counter circuit 21, the access control circuit 25b and the refresh determination circuit 27a when supplied with an external clock ECLK for an external access operation. The access control circuit 25b, receiving a refresh request signal from the refresh control circuit 22 and a refresh determination signal RefE from the refresh determination circuit 27a, has a function of generating an internal clock ICLK2 for a refresh operation with the internal clock generation circuit 24 when performing a refresh operation after terminating an internal access operation. As to the remaining functions, the access control circuit 25b is similar to the access control circuit 25 according to the first embodiment.

When supplied with the external detection pulse CMD from the external access detection circuit 20b upon detection of the external access operation, the refresh determination circuit 27a outputs a refresh determination signal RefE of a high or low level on the basis of the operating state of the access control circuit 25b. The access counter circuit (counter) 21, the refresh control circuit 22 and the refresh division control circuit 23 are similar in structure to those of the first embodiment. The cycle (65 nsec., for example) of the external clock ECLK is set to be longer than the cycles (60 nsec. and 20 nsec., for example) of an internal clock ICLK1 and the internal clock ICLK2.

The remaining structure of the third embodiment is similar to that of the aforementioned first embodiment.

Operations of the simple matrix ferroelectric memory according to the third embodiment of the present invention are now described with reference to FIGS. 2, 10 and 11. In the following description, it is assumed that the external access frequency counted by the access counter circuit 21 has reached a prescribed frequency ($10^6$ times, for example) allowing suppression of data disturbance by refreshment in an external access operation preceding an external access operation A shown in FIG. 11 and the refresh control circuit 22 outputs a refresh request signal to the access control circuit 25b.

Figure 11:
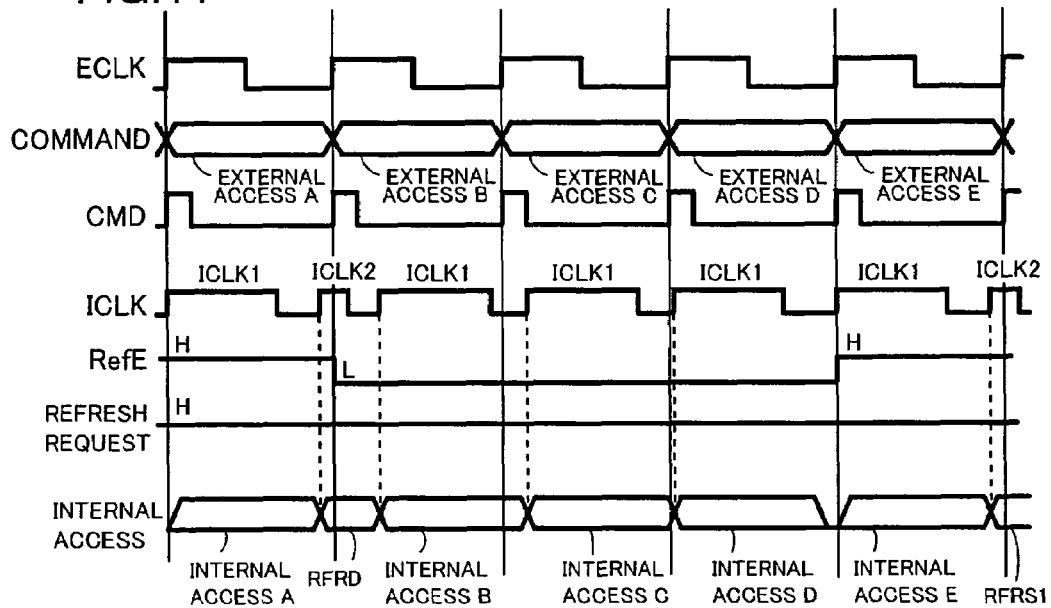
FIG. 11 is a voltage waveform diagram for illustrating operations of the simple matrix ferroelectric memory according to the third embodiment of the present invention.

When detecting an external clock ECLK for the external access operation A, the external access detection circuit 20b generates an external access detection pulse CMD and supplies this external access detection pulse CMD to the access counter circuit 21, the access control circuit 25b and the refresh determination circuit 27a, as shown in FIGS. 10 and 11. When supplied with the external access detection pulse CMD upon detection of the external access operation A, the access counter circuit 21 counts up the external access frequency by +1 and supplies data of the resulting external access frequency to the refresh control circuit 22. When supplied with the external access detection pulse CMD upon detection of the external access operation A, the refresh determination circuit 27a determines whether the access control circuit 25b is in an internal access operation state or in a refresh operation state.

The access control circuit 25b is neither in an internal access operation state nor in a refresh operation state upon detection of the external access operation A, whereby the refresh determination circuit 27a steps up the refresh determination signal RefE to a high level. The refresh determination circuit 27a holds the refresh determination signal RefE at the high level until the external access detection circuit 20b detects a subsequent external access operation B.

The access control circuit 25b is neither in an internal access operation state nor in a refresh operation state upon detection of the external access operation A, whereby the refresh determination circuit 27a steps up the refresh determination signal RefE to a high level. The refresh determination circuit 27 holds this refresh determination signal RefE at the high level until the external access detection circuit 20b detects the subsequent external access operation B.

When supplied with the external access detection pulse CMD upon detection of the external access operation A, the access control circuit 25b, neither in an internal access operation state nor in a refresh operation state, generates an internal clock ICLK1 having the cycle (60 nsec., for example) shorter than the cycle (65 nsec., for example) of the external access operation A for one cycle with the internal clock generation circuit 24. Then, the access control circuit 25b performs an internal access operation A similar to that in the first embodiment in this cycle of the internal clock ICLK1.

Upon termination of the internal access operation A with termination of one cycle of the internal clock ICLK1, the refresh determination signal RefE is held at the high level. Further, the access control circuit 25b is supplied with the refresh request signal from the refresh control circuit 22. Thus, the access control circuit 25b generates an internal clock ICLK2 for a refresh operation for one cycle with the internal clock generation circuit 24 and supplies a refresh signal to the refresh control circuit 22. Consequently, the ferroelectric memory enters a refresh operation state. The refresh control circuit 22, receiving a division signal requesting only a read operation RFRD forming a first cycle in the refresh operation divided into three cycles from the refresh division control circuit 23, performs the read operation RFRD so that a latch train 14 holds data of a word line WL (word line WL1, for example). The refresh control circuit 22 performs the read operation RFRD similarly to the refresh control circuit 22 according to the aforementioned first embodiment.

Upon initiation of the external access operation B (see FIG. 11), the external access detection circuit 20b detects an external clock ECLK. Thus, the external access detection circuit 20b generates an external access detection pulse CMD and supplies this external access detection pulse CKD to the access counter circuit 21, the access control circuit 25b and the refresh determination circuit 27a. When supplied with the external access detection pulse CMD, the access counter circuit 21 counts up the external access frequency by +1 and supplies data of the resulting external access frequency to the refresh control circuit 22. When supplied with the external access detection pulse CMD upon detection of the external access operation B, the refresh determination circuit 27a determines whether the access control circuit 25b is in an internal access state or in a refresh operation state. The access control circuit 25b performs the read operation RFRD of the refresh operation upon detection of the external access operation B, whereby the refresh determination circuit 27a steps down the refresh determination signal RefE to a low level.

The access control circuit 25b, supplied with the external access detection pulse CMD upon detection of the external access operation B, has not yet terminated the read operation RFRD of the refresh operation initiated in the period of the precedent external access operation A. Therefore, the access control circuit 25b generates no internal clock ICLK1, to perform no internal access operation B. Upon termination of the read operation RFRD initiated in the period of the external access operation A, the access control circuit 25b generates an internal clock ICLK1 for one cycle with the internal clock generation circuit 24 and initiates an internal access operation B. Then, the access control circuit 25b performs the internal access operation B in this cycle of the internal clock ICLK1.

Upon initiation of a subsequent external access operation C (see FIG. 11), the external access detection circuit 20b detects an external clock ECLK. Thus, the external access detection circuit 20b generates an external access detection pulse CMD and supplies this external access detection pulse CMD to the access counter circuit 21, the access control circuit 25b and the refresh determination circuit 27a. The access counter circuit 21 supplied with the external access detection pulse CMD counts up the external access frequency by +1 and supplies data of the resulting external access frequency to the refresh control circuit 22. When supplied with the external detection pulse CMD upon detection of the external access operation C, the refresh determination circuit 27a determines whether the access control circuit 25b is in an internal access operation state or in a refresh operation state. The access control circuit 25b performs the internal access operation B upon detection of the external access operation C, whereby the refresh determination circuit 27a holds the refresh determination signal RefE at the low level.

The access control circuit 25b, supplied with the external access detection pulse CMD upon detection of the external access operation C, has not yet terminated the internal access operation B. Therefore, the access control circuit 25b generates no internal clock ICLK1, to perform no internal access operation C. Upon termination of the internal access operation B, the access control circuit 25b generates an internal clock ICLK1 for one cycle with the internal clock generation circuit 24 and initiates an internal access operation C without a refresh operation since the refresh determination signal RefE is at the low level. Then, the access control circuit 25b performs the internal access operation C in this cycle of the internal clock ICLK1.

Upon initiation of a subsequent external access operation D (see FIG. 11), the external access detection circuit 20b detects an external clock ECLK. Thus, the external access detection circuit 20b generates an external access detection pulse CMD and supplies this external access detection pulse CMD to the access counter circuit 21, the access control circuit 25b and the refresh determination circuit 27a. When supplied with the external access detection pulse CMD, the access counter circuit 21 counts up the external access frequency by +1 and supplies data of the resulting external access frequency to the refresh control circuit 22. When supplied with the external access detection pulse CMD upon detection of the external access operation D, the refresh determination circuit 27a determines whether the access control circuit 25b is in an internal access operation state or in a refresh operation state. The access control circuit 25b performs the internal access operation C upon detection of the external access operation D, whereby the refresh determination circuit 27a holds the refresh determination signal RefE at the low level.

The access control circuit 25b, supplied with the external access detection pulse CMD upon detection of the external access operation D, has not yet terminated the internal access operation C. Therefore, the access control circuit 25b generates no internal clock ICLK1, to perform no internal access operation D. When terminating the internal access operation C, the access control circuit 25b generates an internal clock ICLK1 for one cycle with the internal clock circuit 24 and initiates an internal access operation D without a refresh operation since the refresh determination signal RefE is at the low level. Then, the access control circuit 25b performs the internal access operation D in this cycle of the internal clock ICLK1. The access control circuit 25b terminates the internal access operation D within the cycle of the external access operation D.

Upon initiation of a subsequent external access operation E (see FIG. 11), the external access detection circuit 20b detects an external clock ECLK. Thus, the external access detection circuit 20b generates an external access detection pulse CMD and supplies this external access detection pulse CMD to the access counter circuit 21, the access control circuit 25b and the refresh determination circuit 27a. When supplied with the external access detection pulse CMD upon detection of the external access operation E, the access counter circuit 21 counts up the external access frequency by +1 and supplies data of the resulting external access frequency to the refresh control circuit 22. When supplied with the external access detection pulse CMD upon detection of the external access operation E, the refresh determination circuit 27a determines whether the access control circuit 25b is in an internal access operation state or in a refresh operation state.

The access control circuit 25b is neither in an internal access operation state nor in a refresh operation state upon detection of the external access operation E, whereby the refresh determination circuit 27a steps up the refresh determination signal RefE to a high level. The refresh determination circuit 27a holds the refresh determination signal RefE at the high level until the external access detection circuit 20b detects a subsequent external access operation.

When supplied with the external access detection pulse CMD upon detection of the external access operation E, the access control circuit 25b, neither in an internal access operation state nor in a refresh operation state, generates an internal clock ICLK1 for one cycle with the internal clock generation circuit 24. Then, the access control circuit 25b performs an internal access operation E in this cycle of the internal clock ICLK1.

Upon termination of the internal access operation E with termination of one cycle of the internal clock ICLK1, the refresh determination signal RefE is held at the high level. Further, the access control circuit 25b is supplied with the refresh request signal from the refresh control circuit 22. Thus, the access control circuit 25b generates an internal clock ICLK2 for a refresh operation for one cycle and supplies a refresh signal to the refresh control circuit 22. Consequently, the ferroelectric memory enters a refresh operation state. The refresh control circuit 22, receiving a division signal requesting only a first rewrite operation RFRS1 forming a second cycle in the refresh operation divided into three cycles from the refresh division control circuit 23, performs the first rewrite operation RFRS1 for rewriting data held in a latch train 14 through the read operation RFRD. The refresh control circuit 22 performs the first rewrite operation RFRS1 similarly to the refresh control circuit 22 according to the first embodiment.

Thereafter the ferroelectric memory repeats the read operation RFRD and the first and second rewrite operations RFRS1 and RFRS2 of the refresh operation similarly to the above until the same refreshes all of 128 word lines WL1 to WL128 similar to those shown in FIG. 2. The ferroelectric memory terminates the refresh operation by refreshing all word lines WL1 to WL128. Thereafter the ferroelectric memory repeats only the internal access operation. When external access operations are performed by a prescribed frequency ($10^6$ times, for example) from initiation of the refresh operation responsive to the precedent refresh request signal, the refresh control circuit 22 supplies a refresh request signal to the access control circuit 25b on the basis of the external access frequency supplied by the access counter circuit 21. Then, the ferroelectric memory performs a refresh operation divided into three cycles on all word lines WL1 to WL128 again.

According to the third embodiment, as hereinabove described, the refresh determination circuit 27 identical to that of the second embodiment is also applicable to the ferroelectric memory periodically subjected to the external access operation synchronous with the external clock ECLK.

The remaining effects of the third embodiment are similar to those of the aforementioned second embodiment.

Fourth Embodiment

Figure 12:
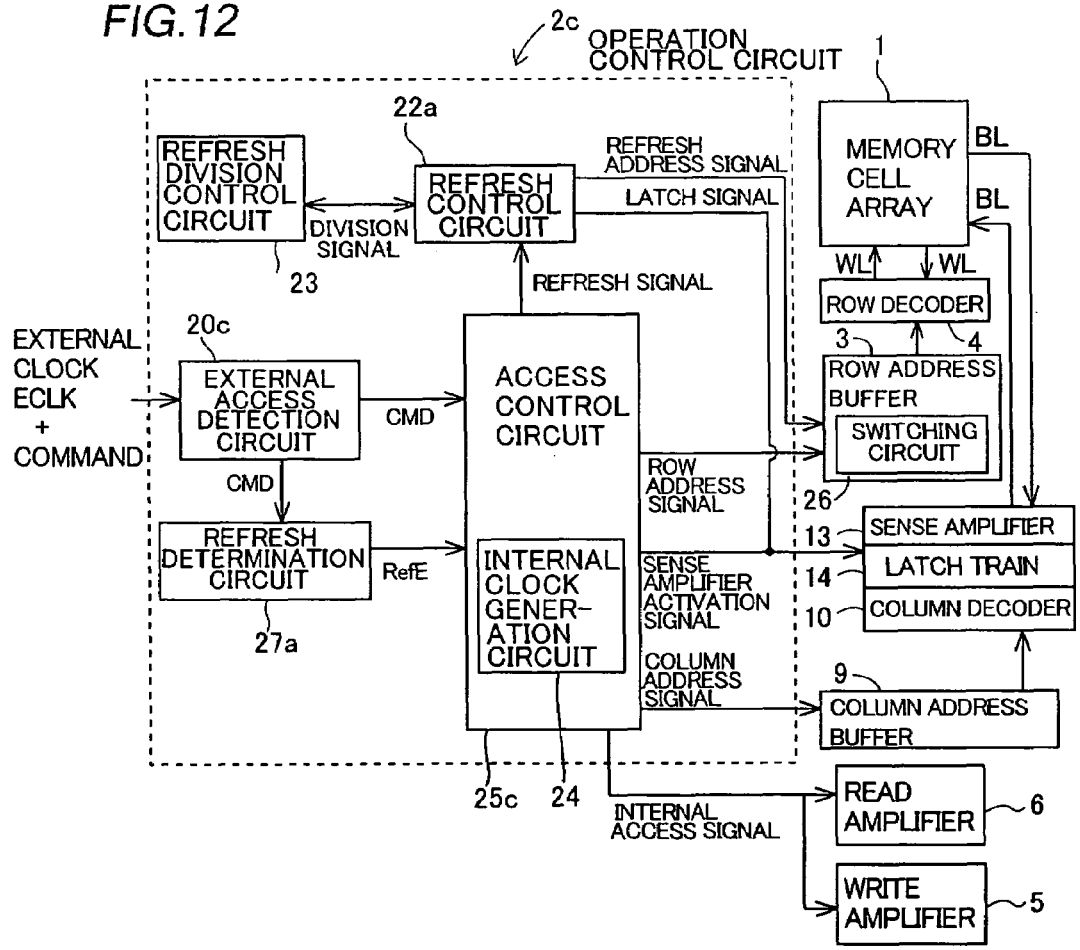
FIG. 12 is a block diagram for illustrating the structure of an operation control circuit of a simple matrix ferroelectric memory according to a fourth embodiment of the present invention.

Referring to FIG. 12, a fourth embodiment of the present invention is applied to a simple matrix ferroelectric memory subjected to an external access operation independently of an external access number, dissimilarly to the aforementioned first to third embodiments.

In the ferroelectric memory according to the fourth embodiment, an operation control circuit 2c includes an external access detection circuit 20c, a refresh control circuit 22a, a refresh division control circuit 23, an access control circuit 25c having an internal clock generation circuit 24 and a refresh determination circuit 27a, as shown in FIG. 12. The external access detection circuit 20c, the refresh control circuit 22a and the access control circuit 25c are examples of the "external access detection portion", the "refresh control portion" and the "access control portion" in the present invention respectively. The external access detection circuit 20c has a function of outputting an external access detection pulse CMD to the access control circuit 25c and the refresh determination circuit 27a when supplied with an external clock ECLK for an external access operation.

The access control circuit 25c, receiving a refresh determination signal RefE from the refresh determination circuit 27a, has a function of generating an internal clock ICLK2 for a refresh operation with the internal clock generation circuit 24 when performing the refresh operation after terminating an internal access operation. As to the remaining functions, the access control circuit 25c is similar to the access control circuit 25 according to the first embodiment. According to the fourth embodiment, the access control circuit 25c receives no refresh request signal from the refresh control circuit 22a, dissimilarly to the first to third embodiments. The refresh division control circuit 23 is similar in structure to that according to the first embodiment. The refresh determination circuit 27a is similar in structure to that according to the third embodiment.

The remaining structure of the fourth embodiment is similar to that of the aforementioned first embodiment.

Operations of the simple matrix ferroelectric memory according to the fourth embodiment of the present invention are now described with reference to FIGS. 2, 12 and 13.

Figure 13:
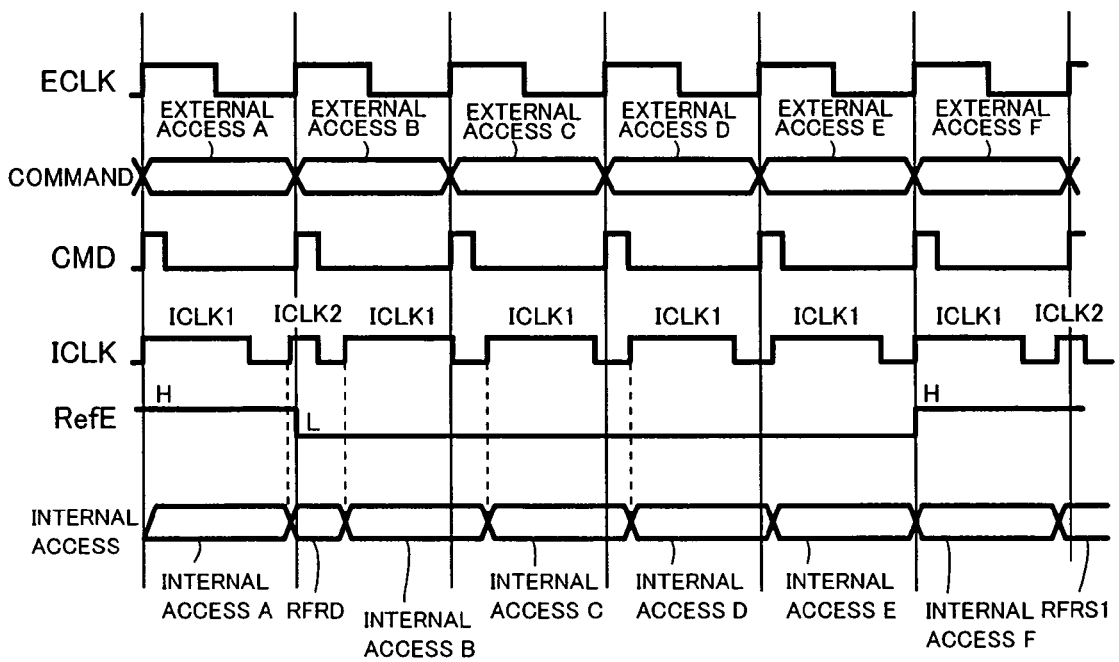
FIG. 13 is a voltage waveform diagram for illustrating operations of the simple matrix ferroelectric memory according to the fourth embodiment of the present invention.

When detecting an external clock ECLK for an external access operation A, the external access detection circuit 20c generates an external access detection pulse CMD and supplies this external access detection pulse CMD to the access control circuit 25c and the refresh determination circuit 27a, as shown in FIGS. 12 and 13. When supplied with the external access detection pulse CMD upon detection of the external access operation A, the refresh determination circuit 27a determines whether the access control circuit 25c is in an internal access operation state or in a refresh operation state.

The access control circuit 25c is neither in an internal access operation state nor in a refresh operation state upon detection of the external access operation A, whereby the refresh determination circuit 27a steps up the refresh determination signal RefE to a high level. The refresh determination circuit 27a holds the refresh determination signal RefE at the high level until the external access detection circuit 20c detects a subsequent external access operation B.

When supplied with the external access detection pulse CMD upon detection of the external access operation A, the access control circuit 25c, neither in an internal access operation state nor in a refresh operation state, generates an internal clock ICLK1 having a cycle (60 nsec., for example) shorter than the cycle (63 nsec., for example) of the external access operation A for one cycle with the internal clock generation circuit 24. Then, the access control circuit 25c performs an internal access operation A similar to that in the first embodiment in this cycle of the internal clock ICLK1.

Upon termination of the internal access operation A with termination of one cycle of the internal clock ICLK1, the refresh determination signal RefE is held at the high level. Therefore, the access control circuit 25c generates an internal clock ICLK2 for a refresh operation for one cycle with the internal clock generation circuit 24 and supplies a refresh signal to the refresh control circuit 22a. Consequently, the ferroelectric memory enters a refresh operation state. The refresh control circuit 22a, receiving a division signal requesting only a read operation RFRD forming a first cycle in the refresh operation divided into three cycles from the refresh division control circuit 23, performs the read operation RFRD so that a latch train 14 holds data of a word line WL (word line WL1, for example). The refresh control circuit 22a performs the read operation RFRD similarly to the refresh control circuit 22 according to the aforementioned first embodiment.

Upon initiation of the external access operation B, the external access detection circuit 20c detects an external clock ECLK. Thus, the external access detection circuit 20c generates an external access detection pulse CMD and supplies this external access detection pulse CMD to the access control circuit 25c and the refresh determination circuit 27a. When supplied with the external access detection pulse CMD upon detection of the external access operation B, the refresh determination circuit 27a determines whether the access control circuit 25c is in an internal access state or in a refresh operation state. The access control circuit 25c performs the read operation RFRD of the refresh operation upon detection of the external access operation B, whereby the refresh determination circuit 27a steps down the refresh determination signal RefE to a low level.

The access control circuit 25c, supplied with the external access detection pulse CMD upon detection of the external access operation B, has not yet terminated the read operation RFRD of the refresh operation initiated in the period of the precedent external access operation A. Therefore, the access control circuit 25c generates no internal clock ICLK1, to perform no internal access operation B. Upon determination of the read operation RFRD initiated in the period of the precedent external access operation A, the access control circuit 25c generates an internal clock ICLK1 for one cycle with the internal clock generation circuit 24 and initiates an internal access operation B. Then, the access control circuit 25c performs the internal access operation B in this cycle of the internal clock ICLK1.

Upon initiation of a subsequent external access operation C, the external access detection circuit 20c detects an external clock ECLK. Thus, the external access detection circuit 20c generates an external access detection pulse CMD and supplies this external access detection pulse CMD to the access control circuit 25c and the refresh determination circuit 27a. When supplied with the external access detection pulse CMD upon detection of the external access operation C, the refresh determination circuit 27a determines whether the access control circuit 25a is in an internal access state or in a refresh operation state. The access control circuit 25c performs the internal access operation B upon detection of the external access operation C, whereby the refresh determination circuit 27a holds the refresh determination signal RefE at the low level.

The access control circuit 25c, supplied with the external access detection pulse CMD upon detection of the external access operation C, has not yet terminated the internal access operation B. Therefore, the access control circuit 25c generates no internal clock ICLK1, to perform no internal access operation C. When terminating the internal access operation B, the access control circuit 25c generates an internal clock ICLK1 for one cycle with the internal clock generation circuit 24 and initiates an internal access operation C without a refresh operation since the refresh determination signal RefE is at the low level. Then, the access control circuit 25c performs the internal access operation C in this cycle of the internal clock ICLK1.

Upon initiation of a subsequent external access operation D, the external access detection circuit 20c detects an external clock ECLK. Thus, the external access detection circuit 20c generates an external access detection pulse CMD and supplies this external access detection pulse CMD to the access control circuit 25c and the refresh determination circuit 27a. When supplied with the external access detection pulse CMD upon detection of the external access operation D, the refresh determination circuit 27a determines whether the access control circuit 25c is in an internal access state or in a refresh operation state. The access control circuit 25c performs the internal access operation C upon detection of the external access operation D, whereby the refresh determination circuit 27a holds the refresh determination signal RefE at the low level.

The access control circuit 25c, supplied with the external access detection pulse CMD upon detection of the external access operation D, has not yet terminated the internal access operation C. Therefore, the access control circuit 25c generates no internal clock ICLK1, to perform no internal access operation D. When terminating the internal access operation C, the access control circuit 25c generates an internal clock ICLK1 for one cycle with the internal clock generation circuit 24 and initiates an internal access operation D without a refresh operation since the refresh determination signal RefE is at the low level. Then, the access control circuit 25c performs the internal access operation D in this cycle of the internal clock ICLK1.

Upon initiation of a subsequent external access operation E, the external access detection circuit 20c detects an external clock ECLK. Thus, the external access detection circuit 20c generates an external access detection pulse CMD and supplies this external access detection pulse CMD to the access control circuit 25c and the refresh determination circuit 27a. When supplied with the external access detection pulse CMD upon detection of the external access operation E, the refresh determination circuit 27a determines whether the access control circuit 25c is in an internal access state or in a refresh operation state. The access control circuit 25c performs the internal access operation D upon detection of the external access operation E, whereby the refresh determination circuit 27a holds the refresh determination signal RefE at the low level.

The access control circuit 25c, supplied with the external access detection pulse CMD upon detection of the external access operation E, has not yet terminated the internal access operation D. Therefore, the access control circuit 25c generates no internal clock ICLK1, to perform no internal access operation E. When terminating the internal access operation D, the access control circuit 25c generates an internal clock ICLK1 for one cycle with the internal clock generation circuit 24 and initiates an internal access operation E without a refresh operation since the refresh determination signal RefE is at the low level. Then, the access control circuit 25c performs the internal access operation E in this cycle of the internal clock ICLK1. The access control circuit 25c terminates the internal access operation E in the period of the external access operation E.

Upon initiation of a subsequent external access operation F, the external access detection circuit 20c detects an external clock ECLK. Thus, the external access detection circuit 20c generates an external access detection pulse CMD and supplies this external access detection pulse CMD to the access control circuit 25c and the refresh determination circuit 27a. When supplied with the external access detection pulse CMD upon detection of the external access operation F, the refresh determination circuit 27a determines whether the access control circuit 25c is in an internal access operation state or in a refresh operation state. The access control circuit 25c is neither in an internal access operation state nor in a refresh operation state upon detection of the external access operation F, whereby the refresh determination circuit 27a steps up the refresh determination signal RefE to a high level. The refresh determination circuit 27a holds the refresh determination signal RefE at the high level until the external access detection circuit 20c detects a subsequent external access operation.

The access control circuit 25c supplied with the external access detection pulse CMD upon detection of the external access operation F, neither in an internal access operation state nor in a refresh operation state, generates an internal clock ICLK1 for one cycle with the internal clock generation circuit 24. Then, the access control circuit 25c performs an internal access operation F in this cycle of the internal clock ICLK.

When the access control circuit 25c terminates the internal access operation F with termination of one cycle of the internal clock ICLK1, the refresh determination signal RefE is held at the high level. Thus, the access control circuit 25c generates an internal clock ICLK2 for a refresh operation for one cycle with the internal clock generation circuit 24 and supplies a refresh signal to the refresh control circuit 22a. Consequently, the ferroelectric memory enters a refresh operation state. The refresh control circuit 22a, receiving a division signal requesting only a first rewrite operation RFRS1 forming a second cycle in the refresh operation divided into three cycles from the refresh division control circuit 23, performs the first rewrite operation RFRS1 for rewriting data held in the latch train 14 through the read operation RFRD. The refresh control circuit 22a performs the first rewrite operation RFRS1 similarly to the refresh control circuit 22 according to the first embodiment.

Thereafter the ferroelectric memory repeats the read operation RFRD and the first and second rewrite operations RFRS1 and RFRS2 of the refresh operation similarly to the above until the same refreshes all of 128 word lines WL1 to WL128 similar to those shown in FIG. 2. When refreshing all word lines WL1 to WL128, the ferroelectric memory refreshes the word line WL1 again.

A current necessary for a refresh operation with respect to the frequency of external access operations necessary for performing the refresh operation is now described.

Consider a case of performing a refresh operation divided every external access frequency L by outputting a refresh request signal when the external access frequency reaches N times. Assuming that M represents the number of word lines, the ferroelectric memory performs the refresh operation divided into three cycles by 3M times in total hen the external access frequency is N times. Therefore, the number of times of the divided refresh operation performed every external access frequency is 3M/N times. Assuming that ICC0 represents current consumption necessary for a single internal access operation, therefore, current consumption per refresh operation divided into three cycles is expressed as ICC0/3, whereby current consumption for the refresh operation per external access operation is expressed as (3M/N)·ICC0/3=(M/N)·ICC0. Current consumption for the internal access operation performed every external access operation is expressed as ICC0. Therefore, current consumption ICC necessary for the internal access operation and the refresh operation every external access operation can be expressed as follows:

$$ICC=\{(M/N)+1\}\cdot ICC0 \quad (1)$$

When regularly performing a refresh operation every external access frequency L without outputting a refresh request signal, the ferroelectric memory performs the refresh operation divided into three cycles once every external access frequency L. Therefore, the ferroelectric memory performs the refresh operation 1/L times every external access operation. Current consumption for the internal access operation performed every external access operation is expressed as ICC0. Current consumption for the refresh operation divided into three cycles is ⅓ of that for a single internal access operation, whereby current consumption for the refresh operation every external access operation is expressed as (⅓L)·ICC0. Therefore, current consumption ICC necessary for the internal access operation and the refresh operation every external access operation can be expressed as follows:

$$ICC=\{(\frac{1}{3}L)+1\}ICC0 \quad (2)$$

Figure 14:
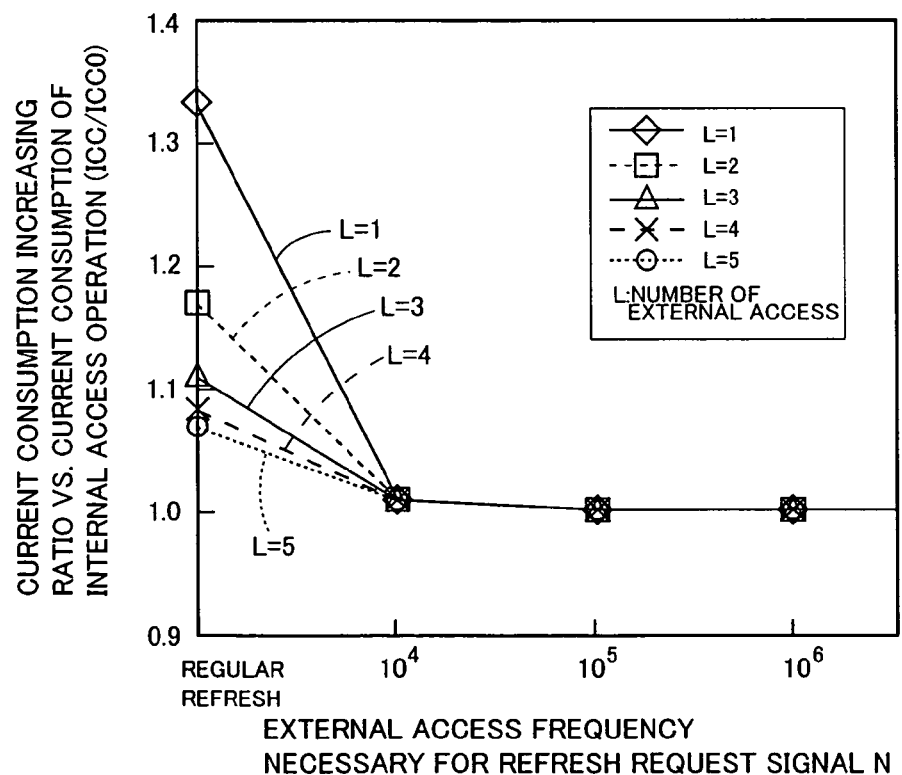
FIG. 14 illustrates the relation between the frequency of external access operations resulting in a refresh operation and a refresh operating current.

If the external access frequency for the divided refresh operation is "5" (L=5) and the ferroelectric memory outputs a refresh request signal and performs a refresh operation when the external access frequency reaches $10^4$ times (N=$10^4$) assuming that the number of the word lines WL is 128 (M=128), current consumption ICC necessary for the internal access operation and the refresh operation every external access operation is expressed as ICC={(128/$10^4$)+1}ICC0≈1.01·ICC0. In other words, current consumption is increased by about 1% in a case of performing the refresh operation every five external access operations only when outputting a refresh request signal as compared with a case of performing only the internal access operation (ICC/ICC0=1), as clearly understood from the value (ICC/ICC0≈1.01) of ICC/ICC0 corresponding to N=$10^4$ times of L=5 in FIG. 14. When the ferroelectric memory regularly performs the divided refresh operation every external access operation (L=1) without outputting a refresh request signal assuming that the number of word lines WL is 128 (M=128) identically to the above, current consumption ICC necessary for the internal access operation and the refresh operation every external access operation is expressed as ICC=1.33·ICC0 from the above equation (2). In other words, current consumption is increased by about 33% when the ferroelectric memory performs the refresh operation every external access operation as compared with the case of performing only the internal access operation (ICC/ICC0=1), as clearly understood from the value (ICC/ICC0≈1.33) of ICC/ICC0 corresponding to regular refreshment of L=1 in FIG. 14. When the ferroelectric memory regularly performs the divided refresh operation every five external access operations (L=5) without outputting a refresh request signal as in the fourth embodiment, on the other hand, current consumption ICC necessary for the internal access operation and the refresh operation every external access operation is expressed as ICC≈1.07·ICC0 from the above equation (2). In other words, current consumption is increased by about 7% when the ferroelectric memory regularly performs the refresh operation every five external access operations as compared with the case of performing only the internal access operation (ICC/ICC0=1), as clearly understood from the value (ICC/ICC0≈1.07) of ICC/ICC0 corresponding to the regular refreshment of L=5 in FIG. 14.

According to the fourth embodiment, as hereinabove described, the ferroelectric memory performs the divided refresh operation every five external access operations without outputting a refresh request signal, thereby further suppressing data destruction resulting from disturbance. When the number of the word lines WL is 128, current consumption is increased by about 7% when the ferroelectric memory performs the divided refresh operation every five external access operations, as compared with the case of performing only the internal access operation. In other words, the ferroelectric memory regularly performs the divided refresh operation every five external access operations, thereby further suppressing disturbance. According to the fourth embodiment, the ferroelectric memory may not be provided with any access counter circuit 21 (see FIG. 3) counting the external access frequency, whereby the circuit structure can be simplified.

The remaining effects of the fourth embodiment are similar to those of the aforementioned third embodiment.

Fifth Embodiment

Figure 15:
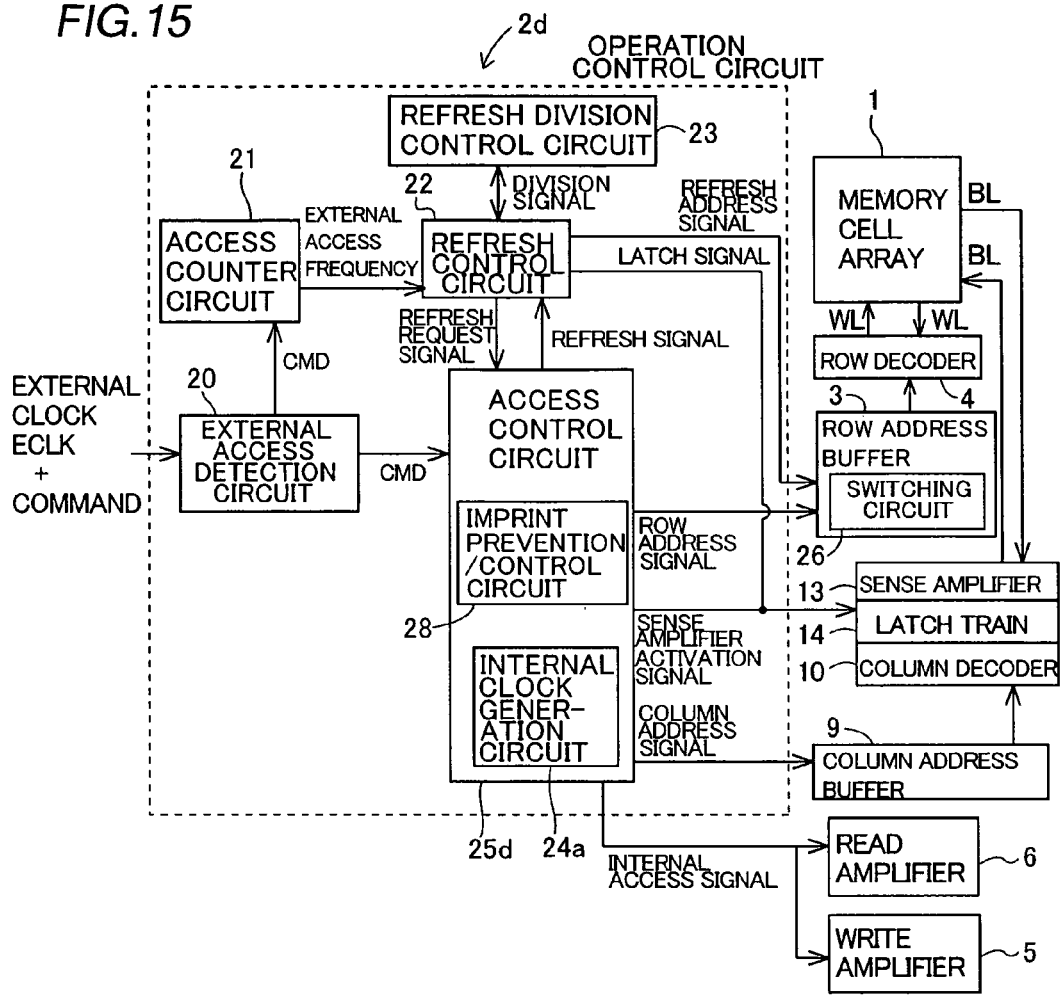
FIG. 15 is a block diagram for illustrating the structure of an operation control circuit of a simple matrix ferroelectric memory according to a fifth embodiment of the present invention.

Referring to FIG. 15, a fifth embodiment of the present invention is applied to a simple matrix ferroelectric memory performing a refresh operation divided into three cycles and adding an additional cycle for preventing such an imprint that a hysteresis loop shifts due to unbalanced voltage application to cause difficulty in writing of reverse data.

In the ferroelectric memory according to the fifth embodiment, an operation control circuit 2d includes an external access detection circuit 20, an access counter circuit 21, a refresh control circuit 22, a refresh division control circuit 23 and an access control circuit 25d having an internal clock generation circuit 24a and an imprint prevention/control circuit 28. The internal clock generation circuit 24a and the access control circuit 25d are examples of the "internal clock generation portion" and the "access control portion" in the present invention respectively. The imprint prevention/control circuit 28 has a function of adding an additional cycle to an internal access operation when the refresh control circuit 22 outputs no refresh request signal. The access control circuit 25d has a function of performing the internal access operation including the additional cycle added by the imprint prevention/control circuit 28 when supplied with no refresh request signal. This access control circuit 25d generates an internal clock ICLK1 for an internal access operation including no additional cycle, an internal clock ICLK2 for a divided refresh operation and an internal clock ICLK3 for the internal access operation including the additional cycle described later with the internal clock generation circuit 24a. The external access detection circuit 20, the access counter circuit 21, the refresh control circuit 22 and the refresh division control circuit 23 are similar in structure to those of the aforementioned first embodiment.

The remaining structure of the fifth embodiment is similar to that of the aforementioned first embodiment.

Operations of the simple matrix ferroelectric memory according to the fifth embodiment of the present invention are now described with reference to FIGS. 2 and 15 to 18. In the following description, it is assumed that an external access frequency counted by the access counter circuit 21 has reached a prescribed frequency ($10^6$ times, for example) allowing suppression of data disturbance by refreshment in an external access operation preceding an external access operation A shown in FIG. 16 and the refresh control circuit 22 outputs a refresh request signal to the access control circuit 25d.

Figure 16:
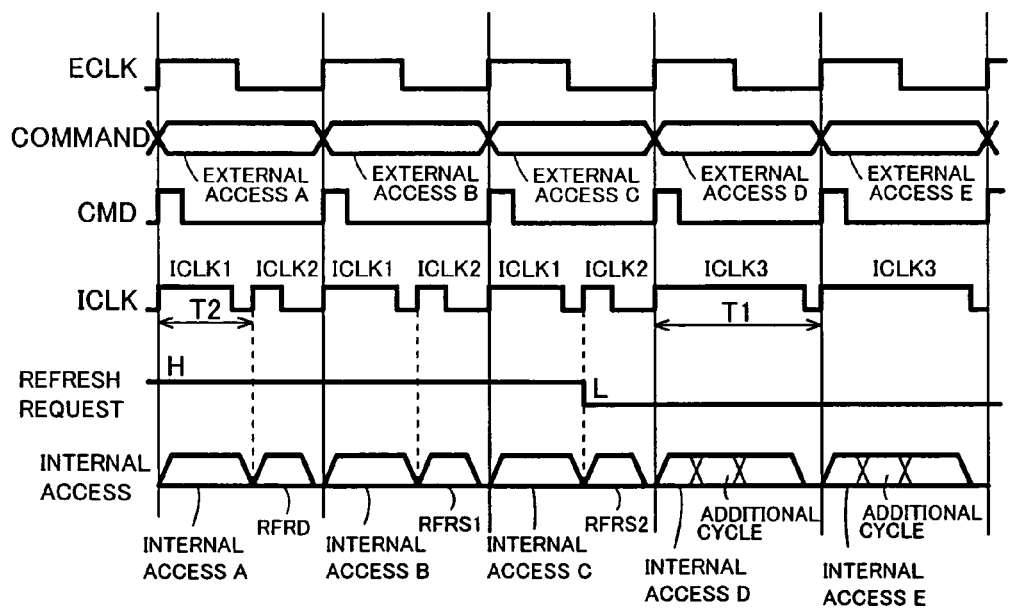
FIG. 16 is a voltage waveform diagram for illustrating operations of the simple matrix ferroelectric memory according to the fifth embodiment of the present invention.

When detecting an external clock ECLK for the external access operation A, the external access detection circuit 20 generates an external access detection pulse CMD and supplies this external access detection pulse CMD to the access counter circuit 21 and the access control circuit 25d, as shown in FIGS. 15 and 16. When supplied with the external access detection pulse CMD upon detection of the external access operation A, the access counter circuit 21 counts up the external access frequency by +1 and supplies data of the resulting external access frequency to the refresh control circuit 22.

When supplied with the external access detection pulse CMD upon detection of the external access operation A, the access control circuit 25d generates an internal clock ICLK1 having a cycle (30 nsec., for example) shorter than the period (50 nsec., for example) of the external access operation A with the internal clock generation circuit 24a. Then, the access control circuit 25d performs an internal access operation A in this cycle of the internal clock ICLK1. The access control circuit 25d performs an internal access operation in a case where a refresh request signal is set to a high level so that a refresh operation is performed after the internal access operation similarly to the internal access operation in the first embodiment.

When terminating the internal access operation A, the access control circuit 25d supplied with the refresh request signal from the refresh control circuit 22 generates an internal clock ICLK2 for performing a refresh operation after termination of the internal access operation A and outputs a refresh signal to the refresh control circuit 22. Consequently, the ferroelectric memory enters a refresh operation state. It is assumed that this is a $128^{th}$ refresh operation after the supply of the refresh request signal. In other words, it is assumed that the word lines WL1 to WL127 have already been refreshed and the ferroelectric memory refreshes a final word line WL128. Then, the refresh control circuit 22 supplied with the refresh signal, supplied with a division signal requesting a read operation RFRD of the refresh operation from the refresh division control circuit 23, performs the read operation RFRD of the refresh operation. The refresh control circuit 22 performs the read operation RFRD of the refresh operation similarly to the refresh control circuit 22 according to the first embodiment. Upon termination of the read operation RFRD, the access control circuit 25d enters a standby state up to initiation of a subsequent external access operation B.

When detecting an external clock ECLK for the external access operation B (see FIG. 16), the external access detection circuit 20 generates an external access detection pulse CMD and supplies this external access detection pulse CMD to the access counter circuit 21 and the access control circuit 25d. When supplied with the external access detection pulse CMD upon detection of the external access operation B, the access counter circuit 21 counts up the external access frequency by +1 and supplies data of the resulting external access frequency to the refresh control circuit 22.

When supplied with the external access detection pulse CMD upon detection of the external access operation B, the access control circuit 25d generates an internal clock ICLK1 for one cycle with the internal clock generation circuit 24a.

Then, the access control circuit 25d performs an internal access operation B in this cycle of the internal clock ICLK1.

When terminating the internal access operation B, the access control circuit 25d supplied with the refresh request signal from the refresh control circuit 22 generates an internal clock ICLK2 for performing a refresh operation after termination of the internal access operation B with the internal clock generation circuit 24a and outputs a refresh signal to the refresh control circuit 22. The refresh control circuit 22, receiving a division signal requesting a first rewrite operation RFRS1 from the refresh division control circuit 23, performs the first rewrite operation RFRS1. Upon termination of the first rewrite operation RFRS1, the access control circuit 25d enters a standby state up to initiation of a subsequent external access operation C.

When detecting an external clock ECLK for the external access operation C (see FIG. 16), the external access detection circuit 20 generates an external access detection pulse CMD and supplies this external access detection pulse CMD to the access counter circuit 21 and the access control circuit 25d. When supplied with the external access detection pulse CMD upon detection of the external access operation C, the access counter circuit 21 counts up the external access frequency by +1 and supplies data of the resulting external access frequency to the refresh control circuit 22.

When supplied with the external access detection pulse CMD upon detection of the external access operation C, the access control circuit 25d generates an internal clock ICLK1 for one cycle with the internal clock generation circuit 24a. Then, the access control circuit 25d performs an internal access operation C in this cycle of the internal clock ICLK1.

When terminating the internal access operation C, the access control circuit 25d supplied with the refresh request signal from the refresh control circuit 22 generates an internal clock ICLK2 for performing a refresh operation after termination of the internal access operation C with the internal clock generation circuit 24a and outputs a refresh signal to the refresh control circuit 22. The refresh control circuit 22, receiving a division signal requesting a second rewrite operation RFRS2 from the refresh division control circuit 23, performs the second rewrite operation RFRS2. The refresh control circuit 22, completely refreshing all word lines WL through the second rewrite operation RFRS2, steps down the refresh request signal to a low level. Upon termination of the second rewrite operation RFRS2, the access control circuit 25d enters a standby state up to initiation of a subsequent external access operation D.

When detecting an external clock ECLK for the external access operation D (see FIG. 16), the external access detection circuit 20 generates an external access detection pulse CMD and supplies this external access detection pulse CMD to the access counter circuit 21 and the access control circuit 25d. When supplied with the external access detection pulse CMD upon detection of the external access operation D, the access counter circuit 21 counts up the external access frequency by +1 and supplies data of the resulting external access frequency to the refresh control circuit 22.

When supplied with the external access detection pulse CMD upon detection of the external access operation D, the access control circuit 25d generates an internal clock ICLK3 for one cycle with the internal clock generation circuit 24a. The period T1 (50 nsec., for example) of the internal clock ICLK3, generated when the access control circuit 25d performs an internal access operation D including an additional cycle described later, is set to be longer than the period T2 (30 nsec., for example) of an internal clock ICLK1 generated when the access control circuit 25d performs an internal access operation including no additional cycle. Then, the access control circuit 25d performs the internal access operation D in this cycle of the internal clock ICLK3.

Figure 17:
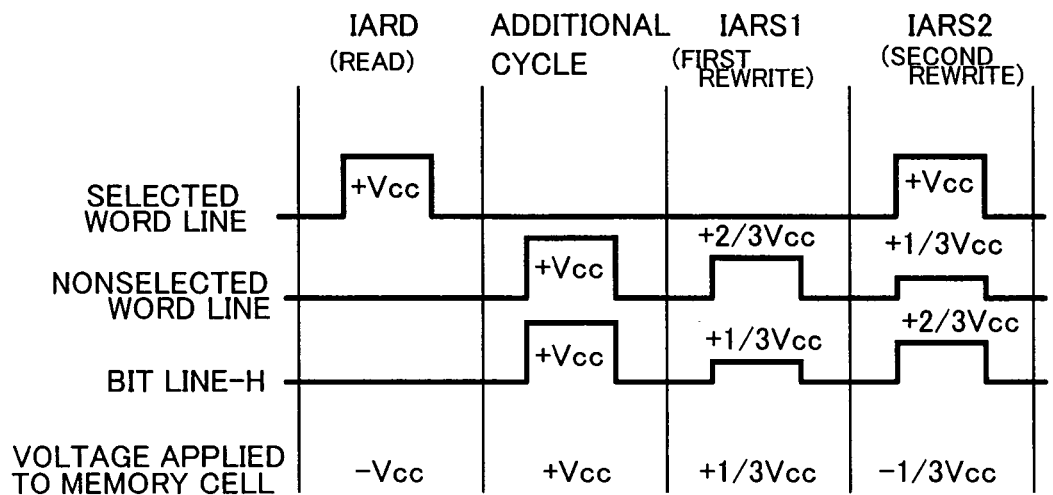
FIGS. 17 and 18 are voltage waveform diagrams for illustrating an internal access operation of the simple matrix ferroelectric memory according to the fifth embodiment of the present invention.
Figure 18:
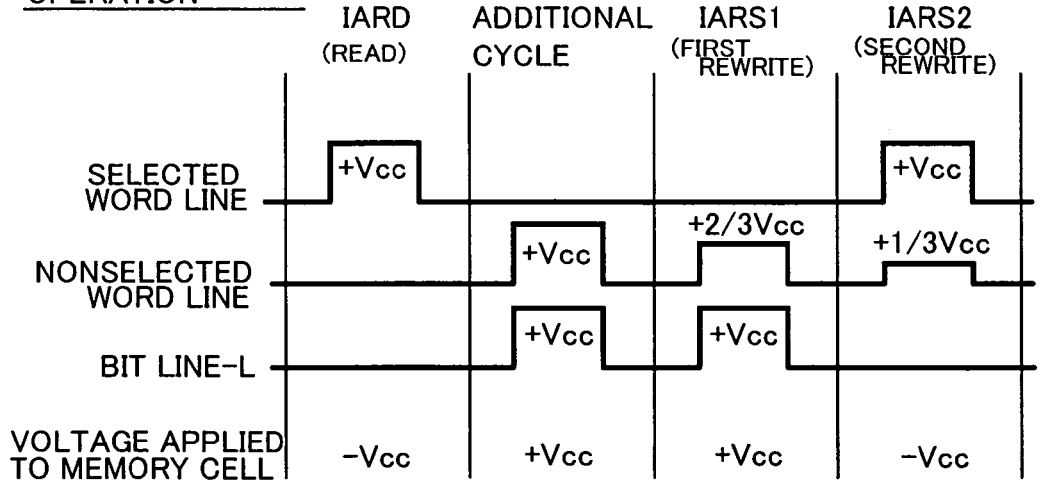

According to the fifth embodiment, the ferroelectric memory continuously performs a divided read operation IARD, an additional cycle added by the imprint prevention/control circuit 28, a first rewrite operation IARS1 and a second rewrite operation IARS2 in the internal access operation D when setting the refresh request signal to a low level for performing no refresh operation after the internal access operation D, as shown in FIGS. 17 and 18. More specifically, the ferroelectric memory applies a voltage +Vcc to a selected word line WL corresponding to a row address signal of an internal address signal while applying no voltage to bit lines BL thereby collectively reading data stored in all memory cells 17 linked to the selected word line WL through corresponding bit lines BL and thereafter reads data stored in a selected memory cell 17 corresponding to a column address signal with the column decoder 10 in the read operation IARD, as shown in FIGS. 17 and 18. Then, the ferroelectric memory performs the additional cycle so that the sum of voltages applied to the selected word line WL reaches zero in a cycle of the internal access operation D. In this additional cycle, the ferroelectric memory applies the voltage +Vcc to the bit lines BL while applying no voltage to the selected word line WL. The ferroelectric memory applies the same voltage +Vcc as that applied to the bit lines BL in the additional cycle, to apply no voltage to nonselected word lines WL.

The ferroelectric memory has written data "H" in memory cells 17 from which data "H" (data "1") have been read among those linked to the selected word line WL in the aforementioned additional cycle, as shown in FIG. 17. Therefore, the ferroelectric memory so performs the first and second rewrite operations IARS1 and IARS2 as not to apply a voltage exceeding ⅓Vcc to the selected word line WL as an absolute value destroying the data "H" written in the memory cells 17. More specifically, the ferroelectric memory applies no voltage to the selected word line WL while applying a voltage +⅓Vcc to the bit lines BL from which data "H" have been read in the first rewrite operation IARS1. In the second rewrite operation IARS2, the ferroelectric memory applies the voltage +Vcc to the selected word line WL while applying a voltage +⅔Vcc to the bit lines BL from which data "H" have been read. Therefore, the ferroelectric memory applies the voltages to the memory cells 17 connected to the selected word line WL so that −Vcc and +Vcc applied in the read operation IARD and the additional cycle respectively cancel each other and +⅓Vcc and −⅓Vcc applied in the first and second rewrite operations IARS1 and IARS2 respectively cancel each other. Thus, the ferroelectric memory can set the sum of the voltages applied to the memory cells 17 connected to the selected word line WL in a single internal access operation to "0".

In the first rewrite operation IARS1 on the memory cells 17 from which data "H" have been read, the ferroelectric memory applies the voltage +⅔Vcc to the nonselected word lines WL while applying the voltage +⅓Vcc to the bit lines BL from which data "H" have been read. Thus, the ferroelectric memory applies the voltage −⅓Vcc to the memory cells 17 connected to the nonselected word lines WL and the bit lines BL from which data "H" have been read in the first rewrite operation IARS1. In the second rewrite operation IARS2, the ferroelectric memory applies the voltage +⅓Vcc to the nonselected word lines WL while applying the voltage +⅔Vcc to the bit lines BL from which data "H" have been read. Thus, only the voltage +⅓Vcc appears in the memory cells 17 connected to the nonselected word lines WL and the bit lines BL from which data "H" have been read in the second rewrite operation IARS2. Therefore, the ferroelectric memory applies no voltage exceeding ⅓Vcc to the memory cells 17 connected to the nonselected word lines WL and the bit lines BL from which data "H" have been read as an absolute value, while applying the voltages −⅓Vcc and +⅓Vcc generated in the first and second rewrite operations IARS1 and IARS2 respectively to cancel each other.

With respect to memory cells 17 from which data "L" (Data "0") has been read among those linked to the selected word line WL, on the other hand, the ferroelectric memory applies the voltage +Vcc to the bit lines BL from which data "L" have been read while applying no voltage to the selected word line WL thereby writing data "H" in these memory cells 17 in the first rewrite operation IARS1, as shown in FIG. 18. In the second rewrite operation IARS2, the ferroelectric memory applies the voltage +Vcc to the selected word line WL while applying no voltage to the bit lines BL from which data "L" have been read, thereby writing data "L" in the memory cells 17 connected to the selected word line WL and the bit lines BL from which data "L" have been read. Therefore, the ferroelectric memory applies the voltages to the memory cells 17 connected to the selected word line WL and the bit lines BL from which data "L" have been read so that −Vcc and +Vcc applied in the read operation IARD and the additional cycle respectively cancel each other and +Vcc and −Vcc applied in the first and second rewrite operations IARS1 and IARS2 respectively cancel each other. Thus, the ferroelectric memory can set the sum of the voltages applied to the memory cells 17 connected to the selected word line WL to "0" in a single internal access operation.

With respect to the memory cells 17 from which data "L" have been read, the ferroelectric memory applies the voltage +⅔Vcc to the nonselected word lines WL while applying the voltage +Vcc to the bit lines BL from which data "L" have been read. Thus, only the voltage +⅓Vcc appears in the memory cells 17 connected to the nonselected word lines WL and the bit lines BL from which data "L" have been read in the first rewrite operation IARS1. In the second rewrite operation IARS2, the ferroelectric memory applies the voltage +⅓Vcc to the nonselected word lines WL while applying no voltage to the bit lines BL from which data "L" have been read. Thus, the ferroelectric memory applies the voltage −⅓Vcc to the memory cells 17 connected to the nonselected word lines WL and the bit lines BL from which data "L" have been read in the second rewrite operation IARS2. Therefore, the ferroelectric memory applies no voltage exceeding ⅓Vcc to the memory cells 17 connected to the nonselected word lines WL and the bit lines BL from which data "L" have been read as an absolute value, while applying the voltages +⅓Vcc and −⅓Vcc generated in the first and second rewrite operations IARS1 and IARS2 respectively to cancel each other.

When terminating the internal access operation D, the access control circuit 25d supplied with no refresh request signal from the refresh control circuit 22 enters a standby state up to initiation of a subsequent external access operation E without a refresh operation.

When detecting an external clock ECLK for the external access operation E (see FIG. 16), the external access detection circuit 20 generates an external access detection pulse CMD and supplies this external access detection pulse CMD to the access counter circuit 21 and the access control circuit 25d. When supplied with the external access detection pulse CMD upon detection of the external access operation E, the access counter circuit 21 counts up the external access frequency by +1 and supplies data of the resulting external access frequency to the refresh control circuit 22.

When supplied with the external access detection pulse CMD upon detection of the external access operation E, the access control circuit 25d generates an internal clock ICLK3 for one cycle with the internal clock generation circuit 24a. Then, the access control circuit 25d performs an internal access operation E in this cycle of the internal clock ICLK3. Since the refresh request signal is set to the low level, the access control circuit 25d performs the internal access operation E with an additional cycle, similarly to the aforementioned internal access operation D.

According to the fifth embodiment, as hereinabove described, the additional cycle for applying voltages to the nonselected word lines WL and the bit lines BL for canceling difference between potentials applied to the selected memory cell 17 is so provided that the ferroelectric memory can cancel voltages applied to the memory cells 17 connected to the selected word line WL in a single internal access operation, thereby preventing an imprint caused when the sum of all voltages applied to the memory cells 17 is not "0". The term "imprint" denotes such a phenomenon that a hysteresis loop of a ferroelectric substance shifts to the direction of voltage application to cause difficulty in writing of reverse data upon application of a constant-directional voltage to the ferroelectric substance constituting a ferroelectric capacitor 16.

The remaining effects of the fifth embodiment are similar to those of the aforementioned first embodiment.

Sixth Embodiment

Figure 19:
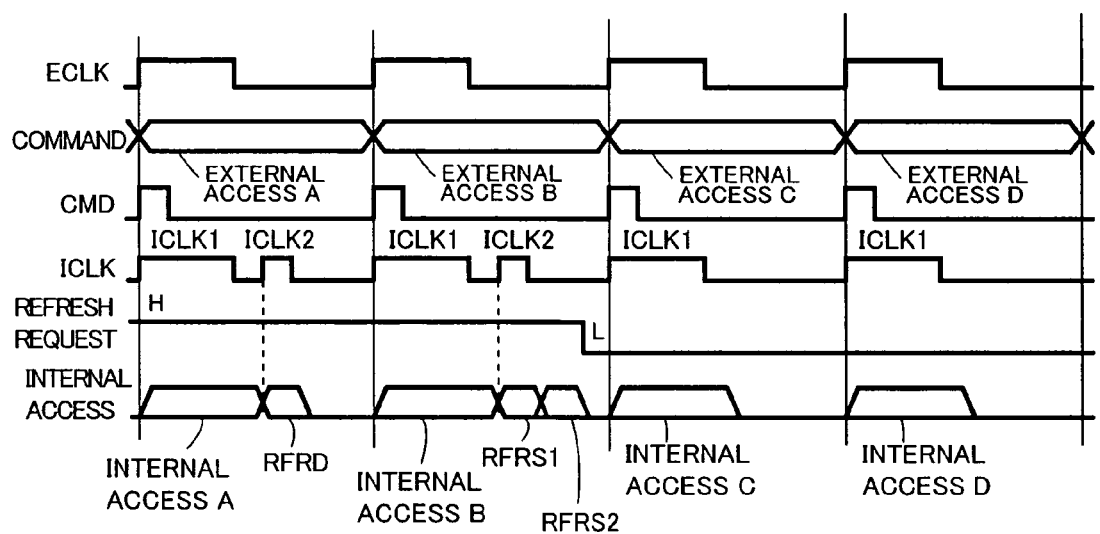
FIG. 19 is a voltage waveform diagram for illustrating operations of a simple matrix ferroelectric memory according to a sixth embodiment of the present invention.

Referring to FIGS. 3 and 19, a simple matrix ferroelectric memory according to a sixth embodiment of the present invention divides a refresh operation into two operations in a structure similar to that of the aforementioned first embodiment. In the following description, it is assumed that an access control circuit 25 (see FIG. 3) is supplied with a high-level refresh request signal in an external access operation precedent to an external access operation A shown in FIG. 19, similarly to the aforementioned first embodiment.

As shown in FIGS. 3 and 19, an external access detection circuit 20 detects an external clock ECLK for the external access operation A, for generating an external access detection pulse CMD and supplying this external access detection pulse CMD to an access counter circuit 21 and the access control circuit 25. Thus, the access counter circuit 21 counts up an external access frequency by +1 and supplies data of the resulting external access frequency to a refresh control circuit 22. The access control circuit 25 generates an internal clock ICLK1 having a cycle shorter than the period of the external access operation A for one cycle with an internal clock generation circuit 24. Then, the access control circuit 25 performs an internal access operation A similar to that in the aforementioned first embodiment in this cycle of the internal clock ICLK1.

When terminating the internal access operation A, the access control circuit 25 supplied with the high-level refresh request signal generates an internal clock ICLK2 for a refresh operation with the internal clock generation circuit 24 and supplies a refresh signal to the refresh control circuit 22. Consequently, the ferroelectric memory enters a refresh operation state. It is assumed that this is a $128^{th}$ refresh operation after the supply of the high-level refresh request signal to the access control circuit 25, similarly to the aforementioned first embodiment.

According to the sixth embodiment, a refresh operation including three cycles (read operation RFRD, first rewrite operation RFRS1 and second rewrite operation RFRS2) is divided into two operations, i.e., the read operation RFRD and a continuous operation of the first and second rewrite operations RFRS1 and RFRS2. More specifically, the refresh control circuit 22 supplied with the refresh signal is supplied with a division signal requesting only the read operation RFRD forming the first cycle among the read operation RFRD and the first and second rewrite operations RFRS1 and RFRS2 included in the refresh operation from a refresh division control circuit 23. In the period of the external access operation A, therefore, the refresh control circuit 22 performs only the read operation RFRD of the refresh operation similarly to the aforementioned first embodiment. Upon termination of the read operation RFRD, the access control circuit 25 enters a standby state up to initiation of a subsequent external access operation B.

Then, the external access detection circuit 20 detects an external clock ECLK for the external access operation B, for generating an external access detection pulse CMD and supplying this external access detection pulse CMD to the access counter circuit 21 and the access control circuit 25. Thus, the access counter circuit 21 counts up the external access frequency by +1 and supplies data of the resulting external access frequency to the refresh control circuit 22. The access control circuit 25 generates an internal clock ICLK1 for one cycle with the internal clock generation circuit 24. Then, the access control circuit 25 performs an internal access operation B in this cycle of the internal clock ICLK1.

When terminating the internal access operation B, the access control circuit 25 supplied with the high-level refresh request signal generates an internal clock ICLK2 for a refresh operation with the internal clock generation circuit 24 and supplies a refresh signal to the refresh control circuit 22. Consequently, the ferroelectric memory enters a refresh operation state.

According to the sixth embodiment, the refresh control circuit 22 supplied with the refresh signal is supplied with a division signal requesting only the continuous operation of the first and second rewrite operations RFRS1 and RFRS2 forming the second cycle among the read operation RFRD and the first and second rewrite operations RFRS1 and RFRS2 included in the refresh operation upon termination of the internal access operation B. Therefore, the refresh control circuit 22 performs only the continuous operation of the first and second rewrite operations RFRS1 and RFRS2 included in the refresh operation in the period of the external access operation B. Upon termination of the continuous operation of the first and second rewrite operations RFRS1 and RFRS2, the refresh control circuit 22 steps down the refresh request signal to a low level since all of word lines WL1 to WL128 have been refreshed. Further, the ferroelectric memory resets the count of the access counter circuit 21. Thereafter the access control circuit 25 enters a standby state up to initiation of a subsequent external access operation C.

Then, the access control circuit 25 performs an internal access operation C in the period of the external access operation C, similarly to the aforementioned first embodiment. At this time, the access control circuit 25 supplied with no high-level refresh request signal enters a standby state up to initiation of a subsequent external access operation D without a refresh operation after termination of the internal access operation C. Then, the access control circuit 25 performs an internal access operation D in the period of the external access operation D, similarly to the aforementioned first embodiment.

Thereafter the ferroelectric memory repeats only the internal access operation without performing the refresh operation. When the count of the access counter circuit 21 reaches a prescribed frequency ($10^6$ times, for example) again, the refresh control circuit 22 supplies a high-level refresh signal to the access control circuit 25. Then, the ferroelectric memory performs divided refresh operations on all word lines WL1 to WL128 again similarly to the above.

According to the sixth embodiment, as hereinabove described, the refresh operation is divided into two operations, i.e., the read operation RFRD and the continuous operation of the first and second rewrite operations RFRS1 and RFRS2 so that the ferroelectric memory performs the read operation RFRD and the continuous operation of the first and second rewrite operations RFRS1 and RFRS2 after the internal access operations A and B respectively, whereby the period of a refresh operation performed in the period of a single external access operation can be reduced as compared with a case of continuously performing the read and write operations of the refresh operation so that the period of the external access operation (cycle of the external clock ECLK) can be reduced. Consequently, the ferroelectric memory can improve the data transfer rate.

According to the sixth embodiment, further, the refresh operation is divided into two operations, i.e., the read operation RFRD and the continuous operation of the first and second rewrite operations RFRS1 and RFRS2 so that the ferroelectric memory performs the read operation RFRD and the continuous operation of the first and second rewrite operations RFRS1 and RFRS2 after the internal access operations A and B respectively, whereby the ferroelectric memory can perform a single refresh operation in the period of two external access operations when the refresh operation is constituted of the three cycles formed by the read operation RFRD and the first and second rewrite operations RFRS1 and RFRS2. Thus, the ferroelectric memory can complete the refresh operation in an earlier stage when the refresh operation is constituted of the three cycles formed by the read operation RFRD and the first and second rewrite operations RFRS1 and RFRS2, as compared with the ferroelectric memory according to the first embodiment performing a single refresh operation in the period of three external access operations. Consequently, accumulation of disturbance can be efficiently suppressed.

The remaining effects of the sixth embodiment are similar to those of the aforementioned first embodiment.

Seventh Embodiment

Figure 20:
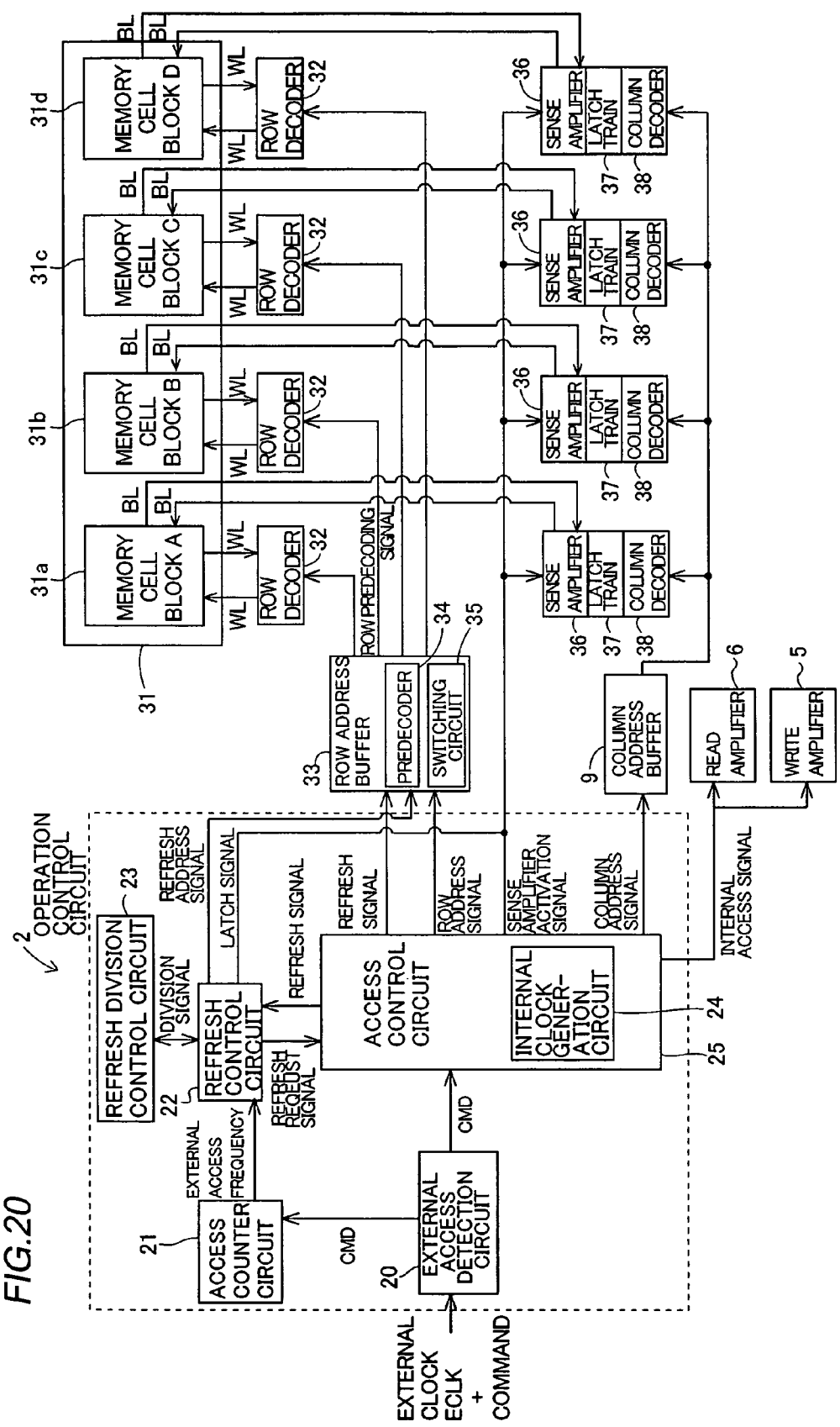
FIG. 20 is a block diagram for illustrating the structure of a simple matrix ferroelectric memory according to a seventh embodiment of the present invention.

Referring to FIG. 20, a simple matrix ferroelectric memory according to a seventh embodiment of the present invention simultaneously refreshes a plurality of word lines in a prescribed period for a refresh operation, dissimilarly to the aforementioned first to sixth embodiments.

In the ferroelectric memory according to the seventh embodiment, a memory cell array 31 is constituted of four memory cell blocks 31a to 31d each including a plurality of (e.g., 32) word lines WL, as shown in FIG. 20. A prescribed number of memory cells (not shown) are connected to each of the plurality of word lines WL. According to the seventh embodiment, the memory cells are arranged on positions where bit lines BL and the word lines WL intersect with each other, similarly to those in the first embodiment shown in FIG. 2.

According to the seventh embodiment, row decoders 32 are connected one by one to the four memory cell blocks 31a to 31d through the corresponding word lines WL respectively. The four row decoders 32 are connected to a row address buffer 33, to be supplied with row predecoding signals from the row address buffer 33. The row address buffer 33 is supplied with a row address signal and a refresh signal from an access control circuit 25 and a refresh address signal from a refresh control circuit 22. This row address buffer 33 has a function of controlling the row predecoding signals supplied to the row decoders 32 on the basis of the row address signal, the refresh signal and the refresh address signal.

More specifically, the row address buffer 33 controls the row predecoding signals to activate only a prescribed word line WL included in one of the four memory cell blocks 31a to 31d when the ferroelectric memory performs an internal access operation in the period of a prescribed external access operation. When the ferroelectric memory performs a refresh operation in the period of a prescribed external access operation, on the other hand, the row address buffer 33 controls the row predecoding signals to activate four prescribed word lines WL included in the respective ones of the four memory cell blocks 31a to 31d at a simultaneous rise timing.

The row address buffer 33 is provided therein with a predecoder 34 and a switching circuit 35. The predecoder 34 provided in the row address buffer 33 has a function of converting only a row predecoding signal supplied to the row decoder 32 corresponding to one of the four memory cell blocks 31a to 31d from a low level to a high level when the ferroelectric memory performs an internal access operation. When the ferroelectric memory performs the internal access operation, the row decoder 32 supplied with the row predecoder signal converted to the high level activates only a prescribed word line WL included in the corresponding one of the four memory cell blocks 31a to 31d on the basis of the row address signal. Further, the predecoder 34 also has a function of converting the row predecoding signals supplied to all row decoders 32 corresponding to the four memory cell blocks 31a to 31d respectively from low levels to high levels on the basis of the refresh signal when the ferroelectric memory performs a refresh operation. When the ferroelectric memory performs the refresh operation, all row decoders 32 supplied with the row predecoding signals converted to the high levels simultaneously activate prescribed word lines WL included in the respective ones of the four memory cell blocks 31a to 31d.

The switching circuit 35 provided in the row address buffer 33 has a function of switching the predecoding signals output from the row address buffer 33 to those for an internal access operation and those for a refresh operation. The switching circuit 35 is an example of the "switching portion" in the present invention.

Sense amplifiers 36, latch trains 37 and column decoders 38 are connected one by one to the four memory cell blocks 31a to 31d through the corresponding bit lines BL respectively. The sense amplifiers 36, the latch trains 37 and the column decoders 38 are similar in function to the sense amplifier 13, the latch train 14 and the column decoder 10 according to the aforementioned first embodiment respectively. The latch trains 37 are examples of the "latch portion" in the present invention.

The remaining structure of the seventh embodiment is similar to that of the aforementioned first embodiment.

Operations of the simple matrix ferroelectric memory according to the seventh embodiment are now described with reference to FIGS. 20 and 21. In the following description, it is assumed that the access control circuit 25 (see FIG. 20) is supplied with a high-level refresh request signal in an external access operation precedent to an external access operation A shown in FIG. 21, similarly to the aforementioned first embodiment.

Figure 21:
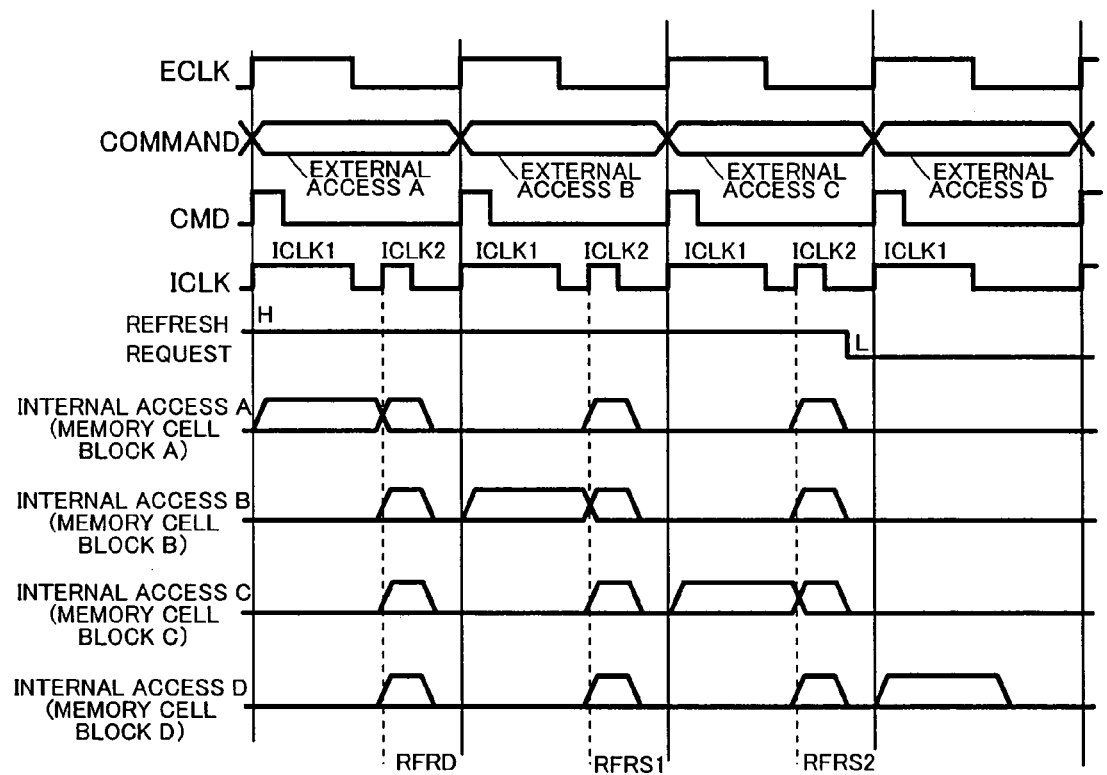
FIG. 21 is a voltage waveform diagram for illustrating operations of the simple matrix ferroelectric memory according to the seventh embodiment of the present invention.

As shown in FIGS. 20 and 21, an external access detection circuit 20 detects an external clock ECLK for the external access operation A, for generating an external access detection pulse CMD and supplying this external access detection pulse CMD to an access counter circuit 21 and the access control circuit 25. Thus, the access counter circuit 21 counts up an external access frequency by +1 and supplies data of the resulting external access frequency to a refresh control circuit 22. The access control circuit 25 generates an internal clock ICLK1 having a cycle shorter than the period of the external access operation A for one cycle with an internal clock generation circuit 24. Then, the access control circuit 25 performs an internal access operation A in this cycle of the internal clock ICLK1.

According to the seventh embodiment, the predecoder 34 converts the row predecoding signal supplied to the row decoder 32 corresponding to the memory cell block 31a from a low level to a high level for activating only a prescribed word line WL included in the memory cell block 31a when the access control circuit 25 performs the internal access operation A in the period of the external access operation A. Further, the predecoder 34 holds the row predecoding signals supplied to the row decoders 32 corresponding to the memory cell blocks 31b to 31d respectively at low levels, not to activate the word lines WL included in the memory cell blocks 31b to 31d. Thus, the ferroelectric memory performs the internal access operation A only on the prescribed word line WL included in the memory cell block 31a on the basis of the row address signal from the access control circuit 25 in the period of the external access operation A.

When terminating the internal access operation A, the access control circuit 25 supplied with the high-level refresh request signal generates an internal clock ICLK2 for a refresh operation with the internal clock generation circuit 24 and supplies a refresh signal to the refresh control circuit 22 and the row address buffer 33. Consequently, the ferroelectric memory enters a refresh operation state. It is assumed that this is a $32^{nd}$ refresh operation after the supply of the high-level refresh request signal to the access control circuit 25, dissimilarly to the aforementioned first embodiment.

According to the seventh embodiment, the refresh control circuit 22 supplied with the refresh signal is supplied with a division signal requesting only a read operation RFRD forming a first cycle among the read operation RFRD and first and second rewrite operations RFRS1 and RFRS2 included in the refresh operation from a refresh division control circuit 23. According to the seventh embodiment, the row address buffer 33 is so supplied with the refresh signal as to convert the row predecoding signals supplied to all row decoders 32 corresponding to the four memory cell blocks 31a to 31d from low levels to high levels. When the ferroelectric memory performs the refresh operation in the period of the external access operation A, therefore, all row decoders 32 activate the prescribed word lines WL included in the memory cell blocks 31a to 31d respectively at a simultaneous rise timing on the basis of the refresh address signal. Consequently, the ferroelectric memory performs the read operation RFRD of the refresh operation on the prescribed word lines WL included in the memory cell blocks 31a to 31d respectively, similarly to the aforementioned first embodiment. Upon termination of the read operation RFRD, the access control circuit 25 enters a standby state up to initiation of a subsequent external access operation B.

Then, the external access detection circuit 20 detects an external clock ECLK for the external access operation B for generating an external access detection pulse CMD and supplying this external access detection pulse CMD to the access counter circuit 21 and the access control circuit 25. Thus, the access counter circuit 21 counts up the external access frequency by +1 and supplies data of the resulting external access frequency to the refresh control circuit 22. The access control circuit 25 generates an internal clock ICLK1 for one cycle with the internal clock generation circuit 24. Then, the access control circuit 25 performs an internal access operation B in this cycle of the internal clock ICLK1.

According to the seventh embodiment, the predecoder 34 converts the row predecoding signal supplied to the row decoder 32 corresponding to the memory cell block 31b from a low level to a high level for activating only a prescribed word line WL included in the memory cell block 31b when the access control circuit 25 performs the internal access operation B in the period of the external access operation B. Further, the predecoder 34 holds the row predecoding signals supplied to the row decoders 32 corresponding to the memory cell blocks 31a, 31c and 31d respectively at low levels, not to activate the word lines WL included in the memory cell blocks 31a, 31c and 31d. Thus, the ferroelectric memory performs the internal access operation B only on the prescribed word line WL included in the memory cell block 31b on the basis of the row address signal from the access control circuit 25 in the period of the external access operation B.

When terminating the internal access operation B, the access control circuit 25 supplied with the high-level refresh request signal generates an internal clock ICLK2 for a refresh operation with the internal clock generation circuit 24 and supplies a refresh signal to the refresh control circuit 22 and the row address buffer 33. Consequently, the ferroelectric memory enters a refresh operation state.

According to the seventh embodiment, the refresh control circuit 22 supplied with the refresh signal is supplied with a division signal requesting only the first rewrite operation RFRS1 forming a second cycle among the read operation RFRD and the first and second rewrite operations RFRS1 and RFRS2 included in the refresh operation from the refresh division control circuit 23. According to the seventh embodiment, the row address buffer 33 is so supplied with the refresh signal as to convert the row predecoding signals supplied to all row decoders 32 corresponding to the four memory cell blocks 31a to 31d from low levels to high levels. When the ferroelectric memory performs the refresh operation in the period of the external access operation B, therefore, all row decoders 32 activate four prescribed word lines WL included in the memory cell blocks 31a to 31d respectively at a simultaneous rise timing on the basis of the refresh address signal. Consequently, the ferroelectric memory performs the first rewrite operation RFRS1 of the refresh operation on the prescribed word lines WL included in the memory cell blocks 31a to 31d respectively, similarly to the aforementioned first embodiment. Upon termination of the first rewrite operation RFRS1, the access control circuit 25 enters a standby state up to initiation of a subsequent external access operation C.

Then, the external access detection circuit 20 detects an external clock ECLK for the external access operation C for generating an external access detection pulse CMD and supplying this external access detection pulse CMD to the access counter circuit 21 and the access control circuit 25. Thus, the access counter circuit 21 counts up the external access frequency by +1 and supplies data of the resulting external access frequency to the refresh control circuit 22. The access control circuit 25 generates an internal clock ICLK1 for one cycle with the internal clock generation circuit 24. Then, the access control circuit 25 performs an internal access operation C in this cycle of the internal clock ICLK1.

According to the seventh embodiment, the predecoder 34 converts the row predecoding signal supplied to the row decoder 32 corresponding to the memory cell block 31c from a low level to a high level for activating only a prescribed word line WL included in the memory cell block 31c when the access control circuit 25 performs the internal access operation C in the period of the external access operation C. Further, the predecoder 34 holds the row predecoding signals supplied to the row decoders 32 corresponding to the memory cell blocks 31a, 31b and 31d respectively at low levels, not to activate the word lines WL included in the memory cell blocks 31a, 31b and 31d. Thus, the ferroelectric memory performs the internal access operation C only on the prescribed word line WL included in the memory cell block 31c on the basis of the row address signal from the access control circuit 25 in the period of the external access operation C.

When terminating the internal access operation C, the access control circuit 25 supplied with the high-level refresh request signal generates an internal clock ICLK2 for a refresh operation with the internal clock generation circuit 24 and supplies a refresh signal to the refresh control circuit 22 and the row address buffer 33. Consequently, the ferroelectric memory enters a refresh operation state.

According to the seventh embodiment, the refresh control circuit 22 supplied with the refresh signal is supplied with a division signal requesting only the second rewrite operation RFRS2 forming a third cycle among the read operation RFRD and the first and second rewrite operations RFRS1 and RFRS2 included in the refresh operation from the refresh division control circuit 23. According to the seventh embodiment, the row address buffer 33 is so supplied with the refresh signal as to convert the row predecoding signals supplied to all row decoders 32 corresponding to the four memory cell blocks 31a to 31d respectively from low levels to high levels. When the ferroelectric memory performs the refresh operation in the period of the external access operation C, therefore, all row decoders 32 activate four prescribed word lines WL included in the memory cell blocks 31a to 31d respectively at a simultaneous rise timing on the basis of the refresh address signal. Consequently, the ferroelectric memory performs the second rewrite operation RFRS2 of the refresh operation on the prescribed word lines WL included in the memory cell blocks 31a to 31d respectively, similarly to the aforementioned first embodiment. Upon termination of the second rewrite operation RFRS2, the refresh control circuit 22 steps down the refresh request signal to a low level since all word lines WL of the four memory cell blocks 31a to 31d have been refreshed. Further, the ferroelectric memory resets the count of the access counter circuit 21. Thereafter the access control circuit 25 enters a standby state up to initiation of a subsequent external access operation D.

Then, the external access detection circuit 20 detects an external clock ECLK for the external access operation D for generating an external access detection pulse CMD and supplying this external access detection pulse CMD to the access counter circuit 21 and the access control circuit 25. Thus, the access counter circuit 21 counts up the external access frequency by +1 and supplies data of the resulting external access frequency to the refresh control circuit 22. The access control circuit 25 generates an internal clock ICLK1 for one cycle with the internal clock generation circuit 24. Then, the access control circuit 25 performs an internal access operation D in this cycle of the internal clock ICLK1.

According to the seventh embodiment, the predecoder 34 converts the row predecoding signal supplied to the row decoder 32 corresponding to the memory cell block 31d from a low level to a high level for activating only a prescribed word line WL included in the memory cell block 31d when the access control circuit 25 performs the internal access operation D in the period of the external access operation D. Further, the predecoder 34 holds the row predecoding signals supplied to the row decoders 32 corresponding to the memory cell blocks 31a to 31c respectively at low levels, not to activate the word lines WL included in the memory cell blocks 31a to 31c. Thus, the ferroelectric memory performs the internal access operation D only on the prescribed word line WL included in the memory cell block 31d on the basis of the row address signal from the access control circuit 25 in the period of the external access operation D.

When terminating the internal access operation D in the period of the external access operation D, the access control circuit 25 supplied with no high-level refresh request signal enters a standby state up to initiation of a subsequent external access operation without a refresh operation.

Thereafter the ferroelectric memory repeats only the internal access operation without the performing refresh operation. When the count of the access counter circuit 21 reaches a prescribed frequency ($10^6$ times, for example) again, the refresh control circuit 22 supplies a high-level refresh signal to the access control circuit 25. Then, the ferroelectric memory performs a refresh operation divided into three operations on all word lines WL of the four memory cell blocks 31a to 31d similarly to the above.

According to the seventh embodiment, as hereinabove described, the ferroelectric memory, simultaneously refreshing prescribed word lines WL included in the four memory blocks 31a to 31d respectively when performing a refresh operation in the period of a prescribed external access operation, can complete the refresh operation in an earlier stage as compared with a case of refreshing only a prescribed word line WL included in one of the four memory cell blocks 31a to 31d when performing the refresh operation in the period of the prescribed external access operation. Consequently, accumulation of disturbance can be efficiently suppressed.

The remaining effects of the seventh embodiment are similar to those of the aforementioned first embodiment.

Eighth Embodiment

Referring to FIGS. 22 to 25, a simple matrix ferroelectric memory according to an eighth embodiment of the present invention activates four word lines WL refreshed in the period of a prescribed external access operation at different rise timings in a structure similar to that of the aforementioned seventh embodiment.

Figure 22:
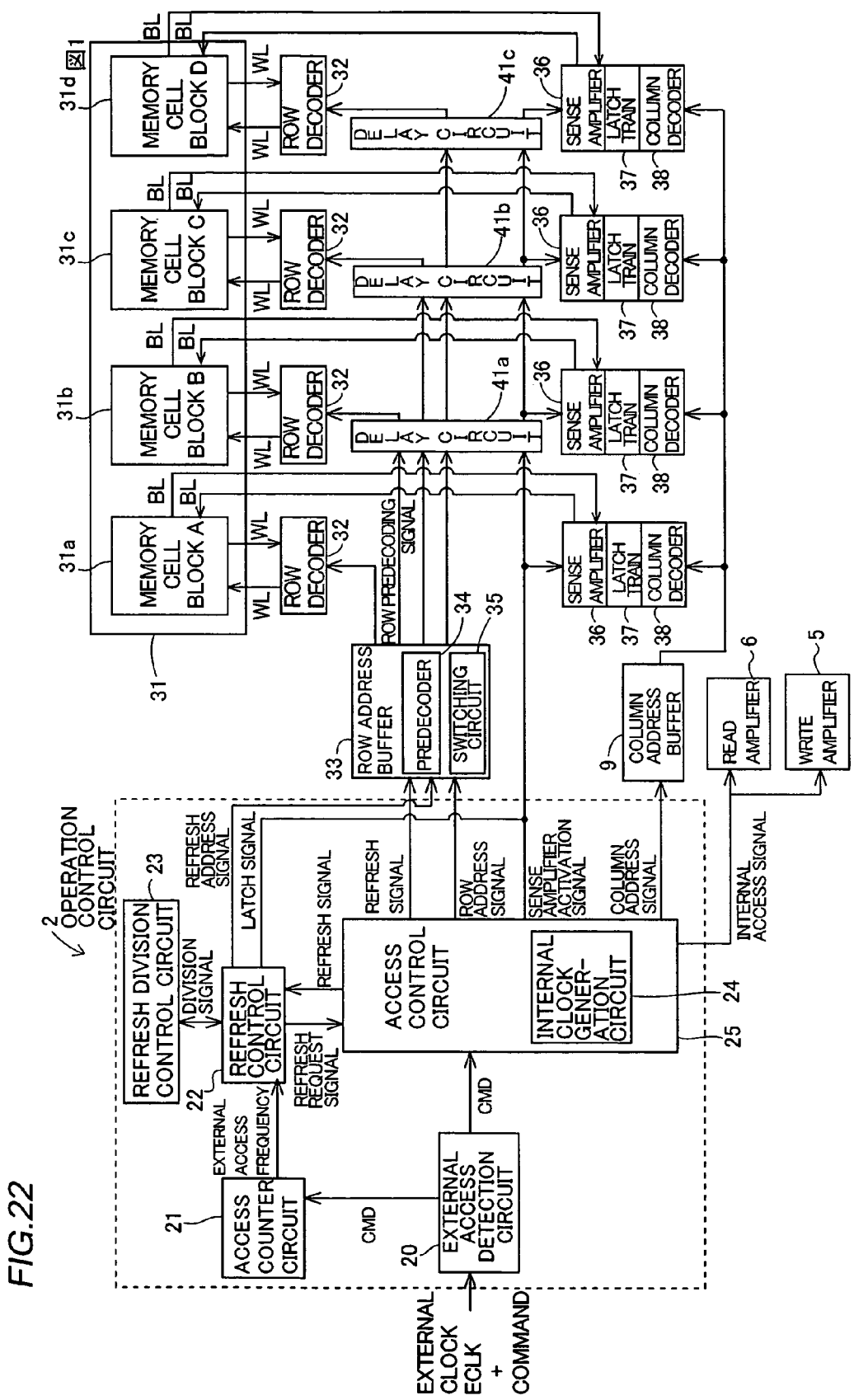
FIG. 22 is a block diagram for illustrating the structure of a simple matrix ferroelectric memory according to an eighth embodiment of the present invention.

In the ferroelectric memory according to the eighth embodiment, a delay circuit 41a is provided between a row address buffer 33 and a row decoder 32 corresponding to a memory cell block 31b in the structure similar to that of the seventh embodiment shown in FIG. 20, as shown in FIG. 22. Further, two delay circuits, i.e., the delay circuit 41a and another delay circuit 41b, are provided between the row address buffer 33 and a row decoder 32 corresponding to another memory cell block 31c. In addition, three delay circuits, i.e., the delay circuits 41a and 41b and still another delay circuit 41c, are provided between the row address buffer 33 and a row decoder 32 corresponding to still another memory cell block 31d. The delay circuits 41a to 41c have functions of delaying supply of row predecoding signals to the row decoders 32.

The aforementioned delay circuits 41a to 41c also have functions of delaying supply of sense amplifier activation signals and latch signals to sense amplifiers 36 and latch trains 37. The sense amplifier 36 (latch train 37) corresponding to the memory cell block 31b is supplied with the corresponding sense amplifier activation signal (latch signal) through the delay circuit 41a. The sense amplifier 36 (latch train 37) corresponding to the memory cell block 31c is supplied with the corresponding sense amplifier activation signal (latch signal) through the delay circuits 41a and 41b. The sense amplifier 36 (latch train 37) corresponding to the memory cell block 31d is supplied with the corresponding sense amplifier activation signal (latch signal) through the delay circuits 41a, 41b and 41c.

Figure 23:
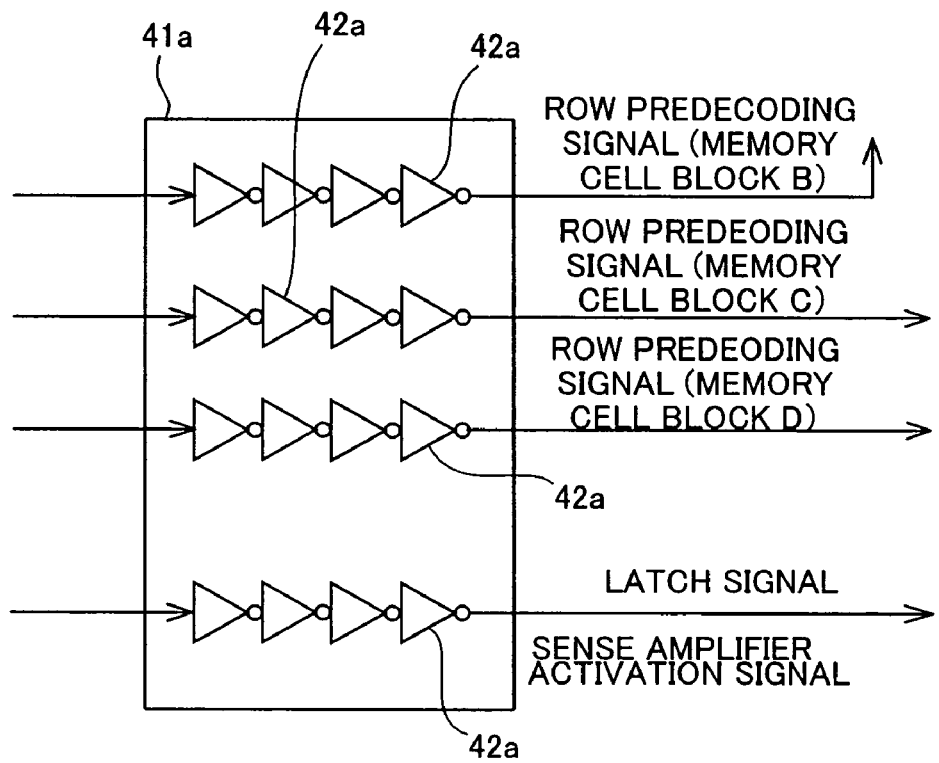
FIGS. 23 to 25 are circuit diagrams of delay circuits of the simple matrix ferroelectric memory according to the eighth embodiment shown in FIG. 22.
Figure 24:
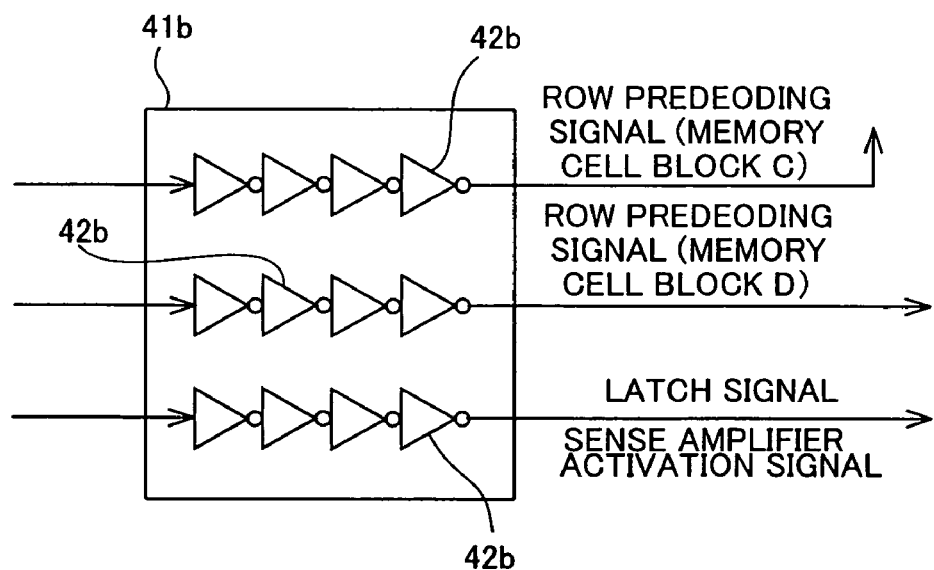
Figure 25:
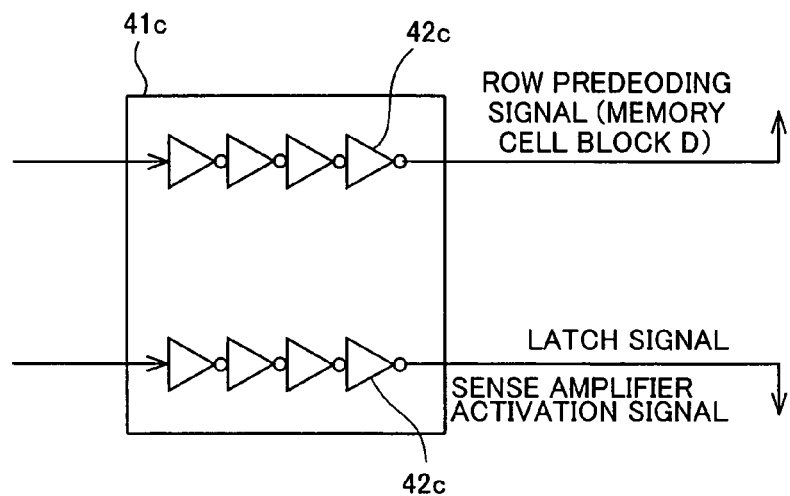

The delay circuit 41a includes four four-stage inverter circuits 42a, as shown in FIG. 23. The four four-stage inverter circuits 42a have functions of delaying three row predecoding signals corresponding to memory cell blocks B to D respectively and a sense amplifier activation signal (latch signal). The delay circuit 41b includes three four-stage inverter circuits 42b, as shown in FIG. 24. The three four-stage inverter circuits 42b have functions of delaying two row predecoding signals corresponding to the memory cell blocks C and D respectively and a sense amplifier activation signal (latch signal). The delay circuit 41c includes two four-stage inverter circuits 42c, as shown in FIG. 25. The two four-stage inverter circuit 42c have functions of delaying a row predecoding signal corresponding to the memory cell block D and a sense amplifier activation signal (latch signal) respectively.

The remaining structure of the eighth embodiment is similar to that of the aforementioned seventh embodiment.

Operations of the simple matrix ferroelectric memory according to the eighth embodiment are now described with reference to FIGS. 22 and 26. In the following description, it is assumed that an access control circuit 25 (see FIG. 22) is supplied with a high-level refresh request signal in an external access operation precedent to an external access operation A shown in FIG. 26, similarly to the aforementioned seventh embodiment.

Figure 26:
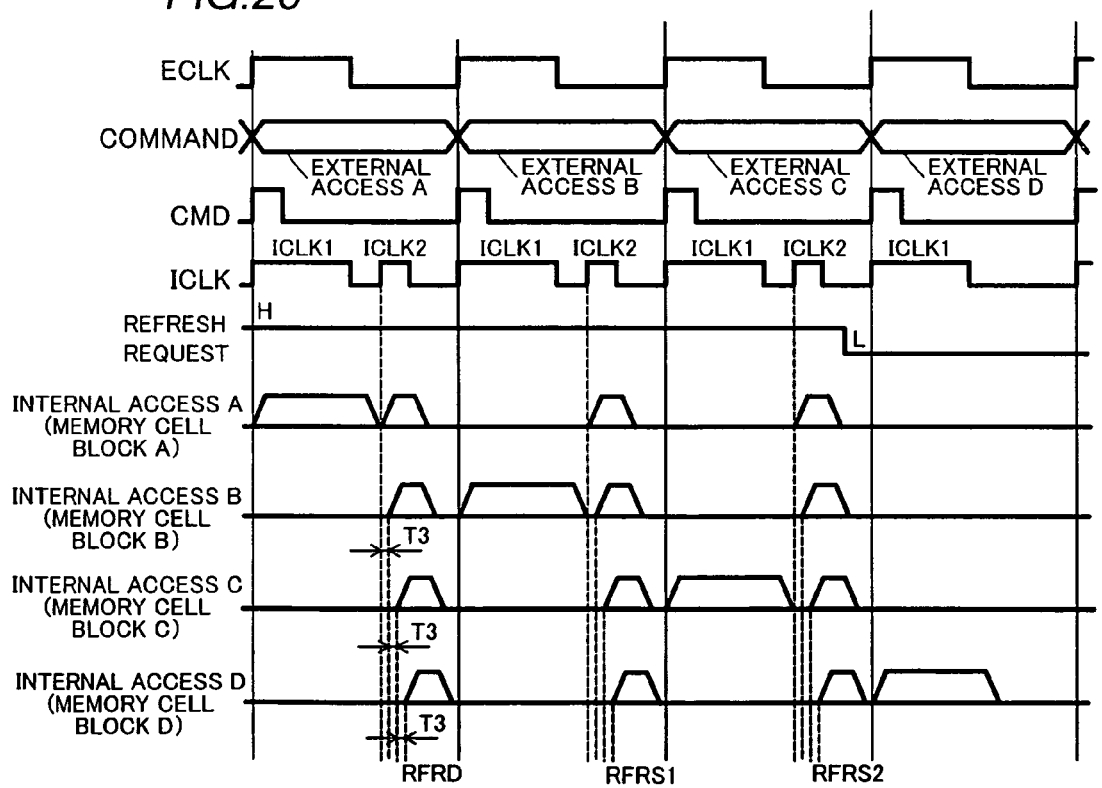
FIG. 26 is a voltage waveform diagram for illustrating operations of the simple matrix ferroelectric memory according to the eighth embodiment of the present invention.

First, the access control circuit 25 performs an internal access operation A only on a prescribed word line WL included in a memory cell block 31a as shown in FIGS. 22 and 26, similarly to the aforementioned seventh embodiment.

When terminating the internal access operation A, the access control circuit 25 supplied with the high-level refresh request signal generates an internal clock ICLK2 for a refresh operation with an internal clock generation circuit 24 and supplies a refresh signal to a refresh control circuit 22 and the row address buffer 33. Consequently, the ferroelectric memory enters a refresh operation state. It is assumed that this is a $32^{nd}$ refresh operation after the supply of the high-level refresh request signal to the access control circuit 25, similarly to the aforementioned seventh embodiment.

According to the eighth embodiment, the refresh control circuit 22 supplied with the refresh signal is supplied with a division signal requesting only a read operation RFRD forming a first cycle among the read operation RFRD and first and second rewrite operations RFRS1 and RFRS2 included in a refresh operation. According to the eighth embodiment, further, the row address buffer 33 supplied with the refresh signal converts the row predecoding signals supplied to all row decoders 32 corresponding to the four memory cell blocks 31a to 31d from low levels to high levels.

At this time, the delay circuit 41a delays the high-level row predecoding signal supplied to the row decoder 32 corresponding to the memory cell block 31b by a prescribed period T3 (about 2 ns to about 5 ns, for example) as compared with the high-level row predecoding signal supplied to the row decoder 32 corresponding to the memory cell block 31a according to the eighth embodiment. Further, the two delay circuits 41a and 41b delay the high-level row decoding signal supplied to the row decoder 32 corresponding to the memory cell block 31c by the prescribed period T3 as compared with the high-level row predecoding signal supplied to the row decoder 32 corresponding to the memory cell block 31b. In addition, the three delay circuits 41a to 41c delay the high-level row predecoding signal supplied to the row decoder 32 corresponding to the memory cell block 31d by the prescribed period T3 as compared with the high-level row predecoding signal supplied to the row decoder 32 corresponding to the memory cell block 31c. Thus, the ferroelectric memory according to the eighth embodiment activates four word lines WL refreshed (subjected to the read operation RFRD) in the period of the external access operation A at different rise timings.

In the ferroelectric memory according to the eighth embodiment reading data at different timings by activating the four word lines WL refreshed (subjected to the read operation RFRD) at different rise timings, the delay circuits 41a to 41c also delay the sense amplifier activation signals (latch signals) supplied to the sense amplifiers 36 (latch trains 37) corresponding to the memory cell blocks 31b to 31d respectively by the prescribed period T3.

Upon termination of the read operation RFRD, the access control circuit 25 enters a standby state up to initiation of a subsequent external access operation B. Thereafter the ferroelectric memory performs an internal access operation B and a refresh operation (first rewrite operation RFRS1) in the period of the external access operation B, and performs an internal access operation C and a refresh operation (second rewrite operation RFRS2) in the period of an external access operation C, similarly to the period of the aforementioned external access operation A. Further, the ferroelectric memory performs only an internal access operation D in the period of an external access operation D without performing a refresh operation.

According to the eighth embodiment, the ferroelectric memory, simultaneously refreshing prescribed word lines WL included in all of the four memory cell blocks 31a to 31d when performing a refresh operation in the period of a prescribed external access operation as hereinabove described, can complete the refresh operation in an early stage similarly to the aforementioned seventh embodiment, whereby accumulation of disturbance can be efficiently suppressed. In this case, the ferroelectric memory can deviate the periods when the four word lines WL are in activated states respectively from each other by activating the four word lines WL refreshed in the period of the prescribed external access operation at different rise timings, thereby reducing a period when the four word lines WL simultaneously enter activated states. Thus, the ferroelectric memory can reduce the peaking time of an operating current, thereby reducing noise caused on a power supply line. Consequently, the ferroelectric memory can be improved in operational reliability.

The remaining effects of the eighth embodiment are similar to those of the aforementioned first embodiment.

Although the present invention has been described and illustrated in detail, it is clearly understood that the same is by way of illustration and example only and is not to be taken by way of limitation, the spirit and scope of the present invention being limited only by the terms of the appended claims.

For example, while the ferroelectric memory performs the refresh operation after terminating the internal access operation in each of the aforementioned first to eighth embodiments, the present invention is not restricted to this but the ferroelectric memory may alternatively perform the refresh operation before the internal access operation. Further alternatively, the ferroelectric memory may perform the refresh operation before the internal access operation, may perform the refresh operation after the internal access operation, and may perform the refresh operation before and after the internal access operation.

While the ferroelectric memory is supplied with the external address signal for the external access operation in each of the aforementioned first to eighth embodiments, the present invention is not restricted to this but is also applicable to a memory having an external access detection circuit supplied with data other than an external address signal as a command for an external access operation.

While the ferroelectric memory collectively refreshes all memory cells linked to the selected word line WL in each of the aforementioned first to eighth embodiments, the present invention is not restricted to this but is also applicable to a case of refreshing every prescribed memory cell arranged on a position where a prescribed word line WL and a prescribed bit line BL intersect with each other.

While the simple matrix ferroelectric memory includes the memory cells formed by the word lines WL, the bit lines BL and the ferroelectric films arranged between the word lines WL and the bit lines BL in each of the aforementioned first to eighth embodiments, the present invention is not restricted to this but is also applicable to a one-transistor ferroelectric memory causing disturbance. The present invention is further applicable to a memory, such as a DRAM requiring refreshment, other than the ferroelectric memory.

Figure 27:
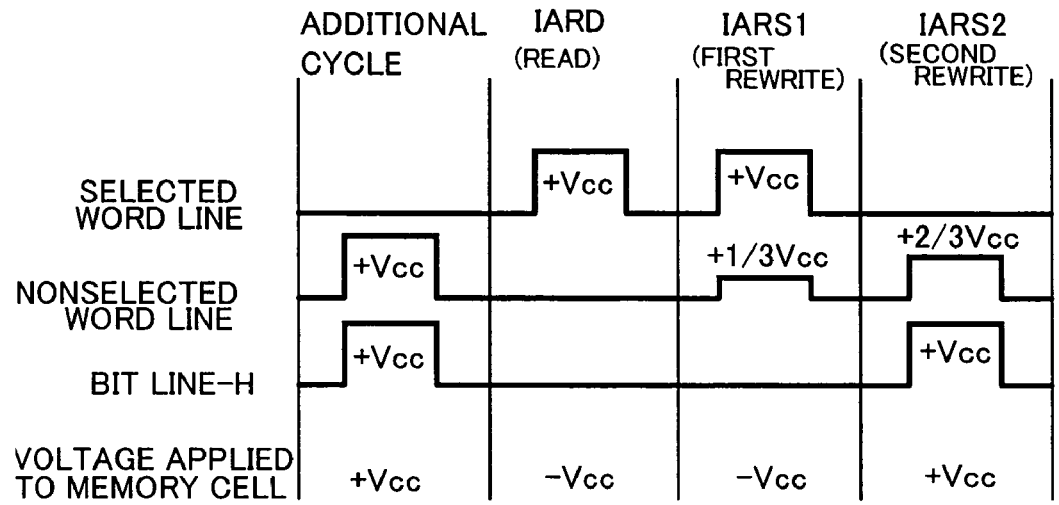
FIGS. 27 and 28 are voltage waveform diagrams for illustrating internal access operations of a simple matrix ferroelectric memory according to a modification of the fifth embodiment of the present invention.
Figure 28:
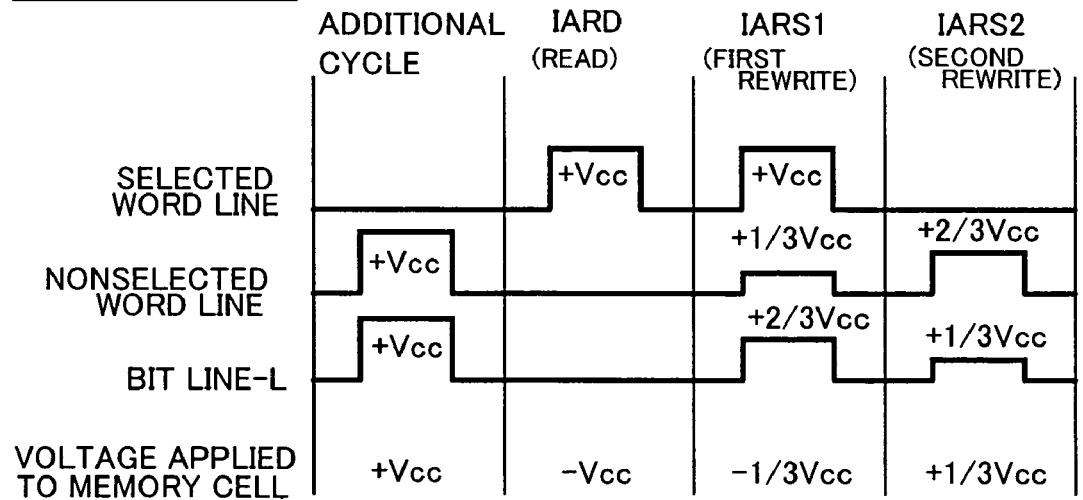

While the ferroelectric memory according to the aforementioned fifth embodiment performs the additional cycle after the read operation IARD, the present invention is not restricted to this but the ferroelectric memory may alternatively perform a read operation IARD after an additional cycle as in a modification of the fifth embodiment shown in FIGS. 27 and 28. According to this structure, the ferroelectric memory writes data "L" (data "0") in memory cells connected to a selected word line after performing the read operation IARD. In order to rewrite data "H" (data "1") in the memory cells connected to the selected word line, therefore, the ferroelectric memory performs first and second rewrite operations IARS1 and IARS2 similarly to the first and second rewrite operations IARS1 and IARS2 according to the first embodiment shown in FIG. 5, as shown in FIG. 27. In order to rewrite data "L" in the memory cells connected to the selected word line, on the other hand, the ferroelectric memory performs first and second rewrite operations IARS1 and IARS2 similarly to the first and second rewrite operations IARS1 and IARS2 according to the first embodiment shown in FIG. 6, as shown in FIG. 28.

While the ferroelectric memory according to the aforementioned fifth embodiment performs the additional cycle for preventing an imprint only in the case of the internal access operation, the present invention is not restricted to this but the ferroelectric memory may alternatively perform the additional cycle for preventing an imprint also in the refresh operation. In this case, the refresh division control circuit divides the refresh operation into four cycles.

While the ferroelectric memory includes the memory cell array constituted of four memory cell blocks in each of the aforementioned seventh and eighth embodiments, the present invention is not restricted to this but the memory cell array may alternatively be constituted of a plurality of memory cell blocks other than four memory cell blocks.

What is claimed is:

1. A memory comprising:
an access control portion performing an internal access operation on the basis of an external access operation;
a refresh control portion performing a refresh operation; and
a refresh division control portion dividing said refresh operation into a read operation and a rewrite operation, for performing said read operation and said rewrite operation at least either before or after different said internal access operations corresponding to different said external access operations respectively.

2. The memory according to claim 1, wherein
said refresh division control portion divides said rewrite operation into a first rewrite operation for writing a first data and a second rewrite operation for writing a second data, and
the memory performs said read operation, said first rewrite operation and said second rewrite operation at least either before or after different said internal access operations corresponding to different said external access operations respectively.

3. The memory according to claim 1, further comprising a latch portion holding data read by said read operation of said refresh operation.

4. The memory according to claim 1, further comprising:
an external access detection portion detecting said external access operation, and
a refresh determination portion determining whether or not to perform said refresh operation on the basis of detection of said external access operation by said external access detection portion and the operating state of said access control portion, wherein
said access control portion performs said refresh operation at least either before or after said internal access operation on the basis of the result of determination of said refresh determination portion.

5. The memory according to claim 4, wherein
said refresh determination portion outputs a signal for said refresh operation if said access control portion performs neither said internal access operation nor said refresh operation when said external access detection portion detects said external access operation.

6. The memory according to claim 4, wherein
said access control portion performs next said internal access operation after termination of previous said internal access operation or said refresh operation if performing said previous internal access operation or said refresh operation when said external access detection portion detects said external access operation.

7. The memory according to claim 1, further comprising an external access counter portion counting the access frequency of said external access operation, wherein
said access control portion performs said refresh operation on the basis of said access frequency counted by said external access counter portion.

8. The memory according to claim 1, performing said refresh operation regardless of the access frequency of said external access operation.

9. The memory according to claim 1, further comprising:
a bit line and a word line arranged to intersect with each other, and
a memory cell arranged on the intersectional position between said bit line and said word line, wherein
said internal access operation includes:
a read operation,
a rewrite operation, and
an additional cycle for applying a voltage to said word line and said bit line for canceling potential difference applied to selected said memory cell in said read operation and said rewrite operation of said internal access operation when the memory performs no said refresh operation.

10. The memory according to claim 1, wherein
said rewrite operation of said refresh operation includes a first rewrite operation for writing a first data and a second rewrite operation for writing a second data, and
the memory performs said read operation of said refresh operation at least either before or after a first internal access operation corresponding to a first external access operation, and
performs said first rewrite operation and said second rewrite operation of said refresh operation at least either before or after a second internal access operation corresponding to a second external access operation.

11. The memory according to claim 1, further comprising a plurality of memory cell blocks each including a plurality of word lines,
for performing said refresh operation on said word lines included in each of at least two of said memory cell blocks when performing said refresh operation along with said internal access operation in the period of prescribed said external access operation.

12. The memory according to claim 11, activating said word lines included in each of said at least two memory cell blocks subjected to said refresh operation at different rise timings when performing said refresh operation along with said internal access operation in said period of said prescribed external access operation.

13. The memory according to claim 12, further comprising a delay circuit.

14. The memory according to claim 1, wherein
said access control portion includes an internal clock generation portion.

15. The memory according to claim 1, wherein
said refresh division control portion divides said rewrite operation into a first rewrite operation for writing first data and a second rewrite operation for writing second data, and
the memory performs divided said refresh operation every time said external access operation is performed a prescribed number of times.

16. The memory according to claim 1, further comprising:
a bit line and a word line arranged to intersect with each other, and
a memory cell arranged on the intersectional position between said bit line and said word line, wherein said refresh division control portion divides said rewrite operation into a first rewrite operation for writing a first data and a second rewrite operation for writing a second data, and said access control portion adds an additional cycle to said internal access operation for applying a voltage to said word line and said bit line for canceling potential difference applied to selected said memory cell in said refresh operation.

17. The memory according to claim 1, further comprising:

a word line and a bit line arranged to intersect with each other, and a memory cell linked to at least said word line, and performing said refresh operation on said memory cell linked to said word line.

18. The memory according to claim 1, further comprising a switching portion switching between a first row address signal corresponding to an internal address signal for said internal access operation and a second row address signal corresponding to a refresh address signal for said refresh operation.

19. The memory according to claim 1, wherein said internal access operation includes a data read operation and a data rewrite operation as well as a data write operation.

20. The memory according to claim 1, performing said read operation and said rewrite operation after different said internal access operations corresponding to different said external access operations respectively.

* * * * *